(12) United States Patent
Rupich et al.

(10) Patent No.: US 10,242,770 B2
(45) Date of Patent: Mar. 26, 2019

(54) LONG LENGTH HIGH TEMPERATURE SUPERCONDUCTING WIRES WITH UNIFORM ION IMPLANTED PINNING MICROSTRUCTURES

(71) Applicants: American Superconductor Corporation, Devens, MA (US); Brookhaven Science Associates, LLC, Upton, NY (US)

(72) Inventors: Martin W. Rupich, Framingham, MA (US); Srivatsan Sathyamurthy, Westford, MA (US); Qiang Li, Setauket, NY (US); Vyacheslav F. Solovyov, Rocky Point, NY (US)

(73) Assignees: American Superconductor Corporation, Ayer, MA (US); Brookhaven Science Associates, LLC, Upton, NY (US)

( * ) Notice: Subject to any disclaimer, the term of this patent is extended or adjusted under 35 U.S.C. 154(b) by 180 days.

(21) Appl. No.: 15/246,739

(22) Filed: Aug. 25, 2016

(65) Prior Publication Data
US 2017/0062098 A1    Mar. 2, 2017

Related U.S. Application Data

(60) Provisional application No. 62/209,988, filed on Aug. 26, 2015.

(51) Int. Cl.
*H01B 12/04* (2006.01)
*H01B 13/00* (2006.01)
*H01L 39/24* (2006.01)

(52) U.S. Cl.
CPC .......... *H01B 12/04* (2013.01); *H01B 13/003* (2013.01); *H01B 13/0016* (2013.01);
(Continued)

(58) Field of Classification Search
CPC ... H01B 12/04; H01B 13/0016; H01B 13/003
See application file for complete search history.

(56) References Cited

U.S. PATENT DOCUMENTS

| 6,638,895 B1 * | 10/2003 | Karapetrov | ......... C04B 41/5353 |
| | | | 204/157.44 |
| 2003/0207043 A1 * | 11/2003 | Fritzemeier | ............. C04B 35/04 |
| | | | 427/551 |

(Continued)

FOREIGN PATENT DOCUMENTS

| EP | 2234121 A1 | 9/2010 |
| WO | 2011017454 A1 | 2/2011 |

OTHER PUBLICATIONS

International Search Report and Written Opinion, dated Dec. 1, 2016, received in international patent application No. PCT/US2016/048520, 13 pgs.

(Continued)

*Primary Examiner* — Paul A Wartalowicz
(74) *Attorney, Agent, or Firm* — Verrill Dana, LLP; John W. Powell

(57) ABSTRACT

A method for producing a long length high temperature superconductor wire, includes providing a substrate, having a surface with a length of at least 50 meters and a width. The surface supports a biaxially textured high temperature superconducting layer and the biaxially textured high temperature superconducting layer has a length and a width corresponding to the length and width of the surface of the substrate. The method includes irradiating the biaxially textured high temperature superconductor layer with an ion beam impinging uniformly along the length and across the width of the biaxially textured high temperature superconductor layer to produce a uniform distribution of pinning microstructures in the biaxially textured high temperature superconductor layer.

32 Claims, 19 Drawing Sheets

(52) U.S. Cl.
CPC ....... *H01B 13/0036* (2013.01); *H01L 39/249* (2013.01); *H01L 39/2483* (2013.01)

(56) References Cited

U.S. PATENT DOCUMENTS

| | | | |
|---|---|---|---|
| 2005/0159298 | A1 | 7/2005 | Rupich et al. |
| 2006/0094603 | A1* | 5/2006 | Li .................. C23C 18/1216 505/445 |
| 2009/0230299 | A1* | 9/2009 | Shichi ................. H01J 27/10 250/282 |
| 2010/0160170 | A1* | 6/2010 | Horimoto ............. B24B 7/13 505/230 |
| 2011/0124508 | A1* | 5/2011 | Miura .................. H01L 39/126 505/230 |
| 2012/0228130 | A1* | 9/2012 | Hanyu .................. C23C 14/08 204/298.04 |
| 2013/0147586 | A1* | 6/2013 | Kennedy ............... B82Y 25/00 335/296 |
| 2014/0249034 | A1* | 9/2014 | Nakayama ............. H01L 39/16 505/163 |
| 2015/0263259 | A1 | 9/2015 | Welp et al. |

OTHER PUBLICATIONS

Strickland N M et al: "Effective Low-Temperature Flux Pinning by Au Ion Irradiation in HTS Coated Conductors", IEEE Transactions on Applied Superconductivity, vol. 25, No. 3, 6600905, Jun. 2015 (Jun. 2015), XP011570375, ISSN:1051-8223.

Yamada Y et al: "Towards the practical PLD-IBAD coated conductor fabrication—Long wire, high production rate and Jc enhancement in a magnetic field", Physica C, vol. 45-448, Jul. 21, 2006(Jul. 21, 2006), pp. 504-508, KP025120539,ISSN: 0921-4534.

Matsui H et al: "4-fold enhancement in the critical current density of YBa2Cu3O7 films by practical ion irradiation", Applied Physics Letters,vol. 101, No. 23, Dec. 3, 2012 (Dec. 3, 2012), pp. 232601-232601, KP012168271, ISSN: 0003-6951.

Mikhailova C et al: "Radiation resistance and generation of pinning centers in composite HTSC under heavy ion irradiation", Physica Status Solidi C, vol. 10, No. 4, Mar. 5, 2012 (Mar. 5, 2012), pp. 677-680, XP055320932, ISSN: 1862-6351.

Rupich M W et al: "Engineered Pinning Landscapes for Enhanced 2G Coil Wire", IEEE Transactions on Applied Superconductivity, vol. 26, No. 3, 6601904, Mar. 15, 2016 (Mar. 15, 2016), XP011605367, ISSN: 1051-8223.

Gapud et al., "Irradiation response of commercial, high-Tc superconducting tapes: Electromagnetic transport properties," *Journal of Nuclear Materials*, 462:108-113, 2015.

Hua et al., "Vortex pinning by compound defects in YBa2Cu3O7," *Physical Review*, B 82:024505.1-024505.4, 2010.

Jia et al., "Doubling the critical current density of high temperature superconducting coated conductors through proton irradiation," *Applied Physics Letters*, 103:122601.1-122601.5, 2013.

Strickland et al., "Enhanced flux pinning in MOD second generation HTS wires by silver- and copper-ion irradiation," *IEEE TAS*, 2007.

Stickland et al., "Flux pinning by discontinuous columnar defects in 74 MeV Ag-irradiated YBa2Cu3O7 coated conductors," *Physica C*, 469:2060-2067, 2009.

\* cited by examiner

LONG LENGTH HIGH TEMPERATURE SUPERCONDUCTING WIRES WITH UNIFORM ION IMPLANTED PINNING MICROSTRUCTURES

CROSS REFERENCE TO RELATED APPLICATIONS

This application claims priority to U.S. Provisional Application No. 62/209,988, filed on Aug. 26, 2015, the contents of which are hereby incorporated by reference in its entirety.

STATEMENT REGARDING FEDERALLY SPONSORED RESEARCH AND DEVELOPMENT

The present invention was made with United States government support under Contract No. DE-AR0000190 awarded by the Advanced Research Projects Agency-Energy and under contract number DE-SC0012704 awarded by the U.S. Department of Energy. The United States government may have certain rights in this invention.

FIELD OF INVENTION

The present invention generally relates to long length high temperature superconducting ("HTS") wires and more particularly to such HTS wires having a uniform distribution of nano-size pinning microstructures along their lengths and widths.

BACKGROUND

Since the discovery of HTS materials (i.e. material that can retain its superconducting properties above the liquid nitrogen temperature of 77K) there have been efforts to develop various engineering applications using such HTS materials. In thin film superconductor devices and wires, most progress has been made with fabrication of devices utilizing an oxide superconductor including yttrium, barium, copper and oxygen in the well-known basic composition of $YBa_2CuO_{7-y}$ (hereinafter referred to as Y123 or YBCO) which remains the preferred material for many applications, including cables, motors, generators, synchronous condensers, transformers, current limiters, and magnet systems for military, high energy physics, materials processing, transportation and medical uses. HTS wire based on these YBCO materials, commonly referred to as Coated Conductor or Second Generation (2G) wire is manufactured in continuous lengths of hundreds of meters or longer with critical current densities, $J_c$, of 3 $MA/cm^2$ or higher at 77 K and self-field using roll-to-roll production lines.

Even though Y123 is the material of choice for HTS applications, these materials exhibit a suppression of $J_c$ in magnetic fields, especially in fields applied along the crystallographic c-axis of the superconductor. This characteristic limits the applicability of these materials in applications that require operation in magnetic fields such as motors, transformers, generators, solenoids, accelerator magnets, energy storage magnets and MRI systems. Hence, it has been important to continue to improve the performance of Y123 superconductors, especially in fields applied in the c-axis direction. More importantly, it is important to achieve these improvements in a roll-to-roll process that is compatible with current wire manufacturing operations and produces a highly uniform and reproducible improvement along the length and width of the production length HTS wires.

One method to achieve such improvement includes "pinning" of superconducting vortices, which is thought to be the underlying mechanism for high critical current density, $J_c$, in HTS materials. To achieve pinning in HTS materials/wires, matching the local potential energy differences as closely as possible to the size of the normal core of the superconducting flux line or vortex have been attempted. It is generally thought that the cross-sectional core has a size on the order of the coherence length (which is several nanometers in HTS cuprates and grows with temperature). Moreover, it is thought that critical currents in polycrystalline HTS materials/wires are still further reduced by weak links at the grain boundaries, which are made worse by porosity, misalignment of the crystalline axis of adjacent grains, and by formation and accumulation of non-superconductor phases (compounds) at boundaries between superconducting grains.

There have been efforts to improve flux pinning of the RE123 superconducting materials. For example, the superconducting properties of $YBa_2Cu_3O_{7-\delta}$ compounds with partial substitutions with europium (Eu), gadolinium (Gd), and samarium (Sm) were found to show an improvement in intra grain Jc (flux pinning). The doping of $YBa_2Cu_3O_{7-\delta}$ with a wide range of dopants at the Y, Ba and Cu sites were also reported. Increased density of twin boundaries was also reported to provide only moderate improvement in flux pinning.

The formation of non-superconducting nano-particles by the introduction of dopants, such rare earth (RE), Zr, Ce, Au, etc., has also been widely evaluated. These materials can form particles by themselves or they may combine to form particles with other elements.

Pinning centers are also formed by the formation of columnar defect structures, for instance by the self-assembly of $BaZrO_3$ into aligned or continuous structures. The most effective of these chemical based approaches has been the formation of self-assembled nano-columns formed from materials such as $BaZrO_3$ or a combination of these nano-columns and nano-particles. Although these pinning microstructures are generally easy to prepare in small R&D samples of the RE123 superconductors, it is much more challenging to incorporate them into continuous lengths of wire. The reason is that the formation of these complex pinning structures depends on having a highly reproducible growth process. Thus, any in-homogeneities in the chemical composition, growth parameters or texture of the superconductor layer over the length or width of the production length wire can affect the precise structure or density of the pinning defects. This change in the pinning structure leads to large variations in the current that the superconductor layer can carry in the presence of magnetic fields. Thus, the performance of the HTS wire varies over its length and/or width and is thus unsuitable for applications requiring a very consistent and predictable critical current.

Additionally, the growth process needed for the formation of the self-assembled columnar microstructures is only applicable to vapor phase deposition processes. Thus, self-assembled columnar pinning microstructures cannot be incorporated into MOD-derived superconducting films.

Introducing defects into HTS wire using high energy particle irradiation has been tried using energies in the 100's of MeV to the 10's of GeV range. At these energy levels, the irradiation generally produced correlated or columnar defects structures which results in anisotropic pinning along their axis.

Although these defect structures were effective in enhancing vortex pinning in the REBCO materials in short research samples, achieving the necessary particle energy levels required expensive research accelerators are not amenable with high volume manufacturing of continuous lengths of superconducting wire. In addition, the particle currents available for the high energy particle irradiation were limited, thus requiring long irradiation times to produce a significant number of defects in the superconducting layer to provide effective pinning.

As described in U.S. Patent Publication No. 2015/0263259, irradiation with low energy particles has also been disclosed. This approach results in point defects that produce a more isotropic pinning structure however it has been focused on producing short samples using a static irradiation beam.

Thus the research efforts to develop vortex pinning microstructures that can be incorporated into the manufacture of long length HTS wires has focused on chemical techniques, described above, that attempt to replicate the combination of correlated and point defects produced by the high energy particle irradiation.

SUMMARY

In one aspect the invention includes a method for producing a long length high temperature superconductor wire. The method includes providing a substrate, having a surface with a length of at least 50 meters and a width. The surface supporting a biaxially textured high temperature superconducting layer and the biaxially textured high temperature superconducting layer having a length and a width corresponding to the length and width of the surface of the substrate. The method also includes irradiating the biaxially textured high temperature superconductor layer with an ion beam impinging uniformly along the length and across the width of the biaxially textured high temperature superconductor layer to produce a uniform distribution of pinning microstructures in the biaxially textured high temperature superconductor layer.

In other aspects of the invention, one or more of the following features may be included. The step of providing may comprise disposing at least one buffer layer on the substrate, forming the biaxially textured high temperature superconductor layer on the at least one buffer layer and depositing a metallic protective coating on the biaxially textured high temperature superconductor layer. The step of providing may also include performing an oxygenation heat treatment to anneal the metallic protective coating and oxygenating the biaxially textured high temperature superconductor layer. The step of irradiating may include impinging the ion beam uniformly on the surface of the metallic protective coating. The step of irradiating may include moving the biaxially textured high temperature superconductor layer in a continuous manner under the ion beam. The ion beam may be shaped in a rectangular pattern and the rectangular pattern of the ion beam may have an aspect ratio of between 1.1:1 to 20:1 or between 2:1 to 10:1. The ion beam may be shaped in a rectangular pattern and a long edge of the rectangular pattern is oriented perpendicular to the length of the biaxially textured high temperature superconductor layer, and wherein the beam is wider than the moving tape by a factor of at least two. The ion beam may be shaped in a rectangular pattern and a long edge of the rectangular beam is oriented parallel to the length of the biaxially textured high temperature superconductor layer.

In yet other aspects of the invention, one or more of the following features may be included. The ion beam may be rastered at a rate of 0-100 kHz and traverses a distance 1.0-10 cm greater than the width of the moving the biaxially textured high temperature superconductor layer. The ion beam may comprise a positively charged ion with energy in the range of 1-25 MeV. The ion beam may comprise Au ions with a charge of from 1+ to 8+. The Au ions may have a charge of 5+. The ion beam may comprise Ar ions with a charge of 1+ to 10+. The ion beam may comprise Xe ions with a charge of 1+ to 10+. The moving step may include moving the biaxially textured high temperature superconductor wire in a continuous manner under the ion beam, at a rate of between 6 m/hr and 1000 m/hr. The step of moving the biaxially textured high temperature superconductor layer in a continuous manner under the ion beam may include moving the biaxially textured high temperature superconductor layer under the ion beam a plurality of times. Moving the biaxially textured high temperature superconductor layer high temperature superconductor layer under the ion beam a plurality of times may include using a reel to reel process with the high temperature superconductor wire being wound helically around the reels. When the biaxially textured high temperature superconductor is moved under the ion beam a plurality of times, each time the ion beam may utilize different ion particles and/or different energies.

In yet further aspects of the invention, one or more of the following features may be included. The irradiating step may include impinging on the metallic protective coating the ion beam with an ion energy of 1 to 25 MeV. The ion beam energy may be selected to achieve substantially full penetration of the impinging ions in the metallic protective coating and the biaxially textured high temperature superconductor superconductor layer. The beam may have an ion bean current selected to prevent heating of the biaxially textured high temperature superconductor layer to temperatures above about 300° C. during the irradiation step. The biaxially textured high temperature superconductor layer may be actively cooled to maintain the temperature below 300° C. The metallic protective layer may comprise Ag with a thickness of between 0.25 to 1.5 μm. The area of the biaxially textured high temperature superconductor layer irradiated per minute may be greater than 0.25 m$^2$/hr. The ion beam may have an ion particle current of >0.5 μA. The ion beam may have an ion particle current of >1 μA. The ion beam may have an ion particle current of >2 μA. The ion beam May have an ion particle current of >4 μA. The width of the biaxially textured high temperature superconductor layer may be between 4 mm to 200 mm. The superconductor wire may be configured as a single strip or as multiple strips along the length.

In yet additional aspects of the invention, one or more of the following features may be included. The ion beam may impinge on the biaxially textured high temperature superconductor layer at an angle perpendicular to the surface of the biaxially textured high temperature superconductor layer. The ion beam may impinge on the biaxially textured high temperature superconductor layer at an angle of between 0 and 75° from an axis perpendicular to the surface of the biaxially textured high temperature superconductor layer. The ion beam may impinge on the biaxially textured high temperature superconductor layer simultaneously at a continuous range of angles from 0 to ±45° from an axis perpendicular to the surface of the biaxially textured high temperature superconductor layer. The pinning microstructures may have a substantially uniform size. The substantially uniform size of the pinning microstructures may be defined as at least 90% of the pinning microstructures in a volume of the biaxially textured superconductor layer having a size of <20 nm. The biaxially textured high temperature superconducting layer may have a thickness of greater than 1 μm. The biaxially textured high temperature superconducting layer may comprise a rare earth metal-alkaline earth metal-transition metal-oxide superconductor layer having a material with the general formula: $(RE)Ba_2Cu_3O_7$ where RE is at least one rare earth metal. RE may comprise yttrium.

In another aspect the invention features a long length high temperature superconductor wire having a substrate, having a surface with a length of at least 50 meters and a width. There is a biaxially textured high temperature superconducting layer supported by the substrate, the biaxially textured high temperature superconducting layer having a length and a width corresponding to the length and width of the surface of the substrate. The biaxially textured high temperature superconductor layer includes a uniform distribution of pinning microstructures having a substantially uniform size. The substantially uniform size is defined as at least 90% of the pinning microstructures in a volume of the biaxially textured superconductor layer have a size of <20 nm. The biaxially textured high temperature superconductor layer exhibits a substantially constant ratio of superconducting critical current density in self-field at a temperature of 77K to superconducting critical current density in a c-axis applied magnetic field of X Tesla at a temperature of Y K measured along the length of the layer.

In other aspects of the invention, one or more of the following features may be included. X may be 2 and Y may be 30. The biaxially textured high temperature superconducting layer may have a thickness of greater than 1 μm. The substrate may be a biaxially textured substrate. The biaxially textured high temperature superconducting layer may comprise a rare earth metal-alkaline earth metal-transition metal-oxide superconductor layer having a material with the general formula: $(RE)Ba_2Cu_3O_7$ where RE is at least one rare earth metal. RE may comprise yttrium.

Additional features, advantages, and embodiments of the present invention may be set forth from consideration of the following detailed description, drawings, and claims. Moreover, it is to be understood that both the foregoing summary of the present disclosure and the following detailed description are exemplary and intended to provide further explanation without further limiting the scope of the present disclosure claimed.

DESCRIPTION OF DRAWINGS

In FIG. 18A the applied magnetic field is oriented in the H//ab-plane direction and in FIG. 18B the applied magnetic field is oriented in the H//c-axis direction

DETAILED DESCRIPTION

Figure 1A:
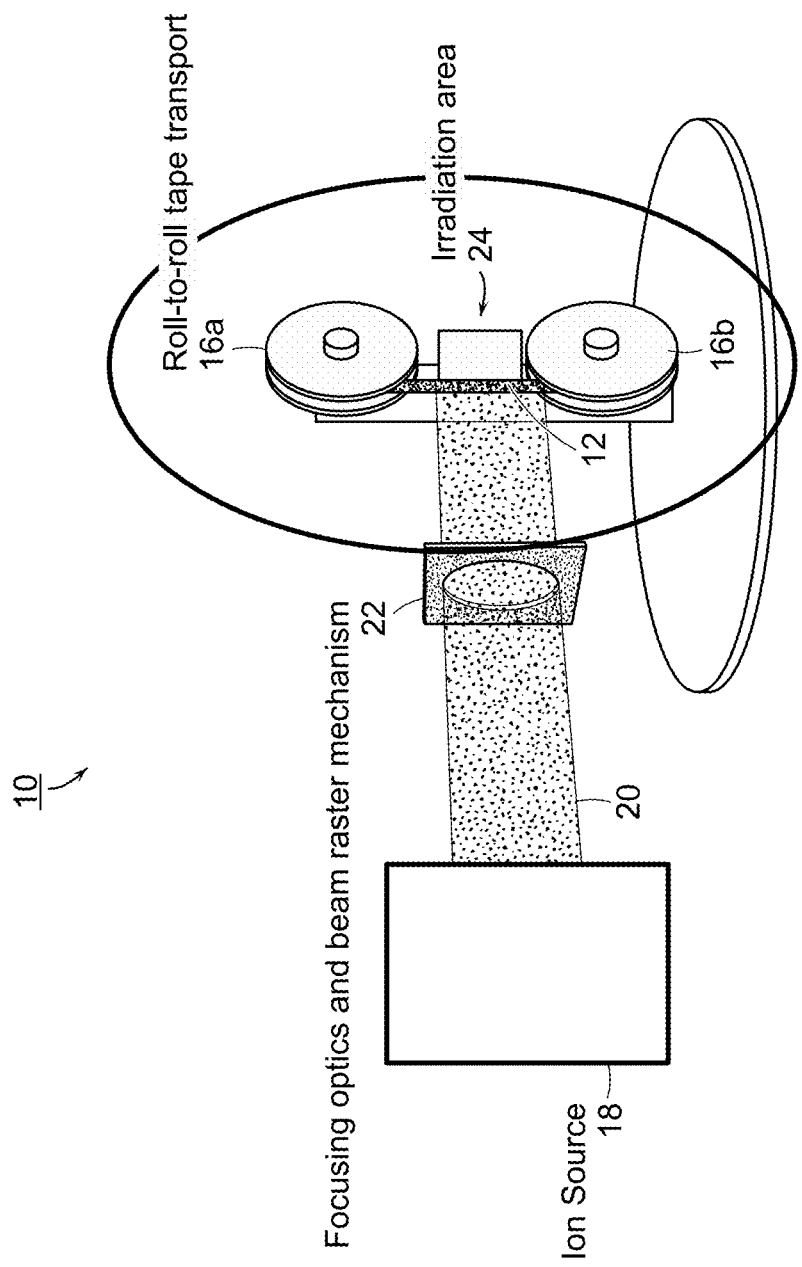
FIG. 1A is an illustration showing the roll-to-roll irradiation of a HTS tape with a particle beam.

Uniformly distributed defects of a substantially uniform size may be formed continuously along the length and width of a superconducting tape by passing the tape through a focused beam of medium energy ions, i.e. 1 to 25 MeV in order to improve the electrical performance of the superconductor tape. In a preferred embodiment, system 10, FIG. 1A, there is shown HTS tape 12 having a length of at least 50 m and more typically of 100 to 2000 m and a width of 2 mm to 1 m. HTS tape is passed through the raster beam 14 of ion particles by transporting the tape from a first roll 16a to a second roll 16b. In a preferred embodiment, the irradiated superconducting tape may be sectioned along its length and converted into multiple superconducting wires. Raster beam 14 is produced by ion source 18 which outputs an ion beam 20 to raster device 22, which focuses ion beam 20 and raster beam 14 across the HTS tape 20 in irradiation area 24.

Figure 1C:
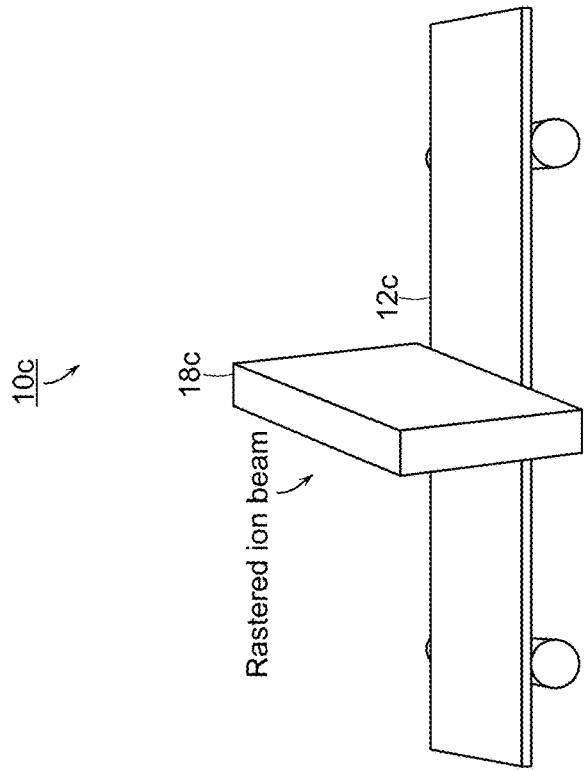
FIG. 1C is an illustration showing the roll-to-roll irradiation of a wide HTS tape with a particle beam.
Figure 1B:
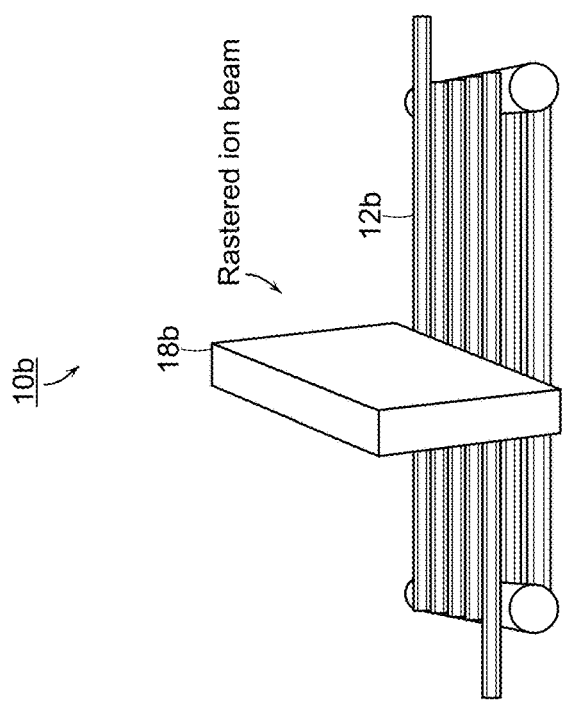
FIG. 1B is an illustration showing the helically wound roll-to-roll irradiation of a HTS tape with a particle beam.

In FIG. 1B there is depicted an alternative HTS wire manufacturing configuration which uses a helically wound HTS tape 12b on a roll-to-roll system being irradiated with a particle beam from ion source 18b. In FIG. 1C there is depicted the roll-to-roll irradiation of a wide HTS tape 12c with a wide HTS tape being irradiated with a particle beam from ion source 18c. Wide, in this context is a relative term, where the width of the tape may typically be between 4 mm and 200 mm. In this case, tape 12c is depicted as a much wider tape or web than HTS tape 12 shown in FIG. 1A. The irradiation process according to this invention is equally applicable to the manufacturing processes of tapes 12a-c.

The irradiation process according to this invention may be introduced or inserted into a HTS wire manufacturing process. The details of the ion beam and the irradiation process are provided below. The process depicted in FIG. 1 is only one step which may be implemented in an overall wire manufacturing process.

Figure 2:
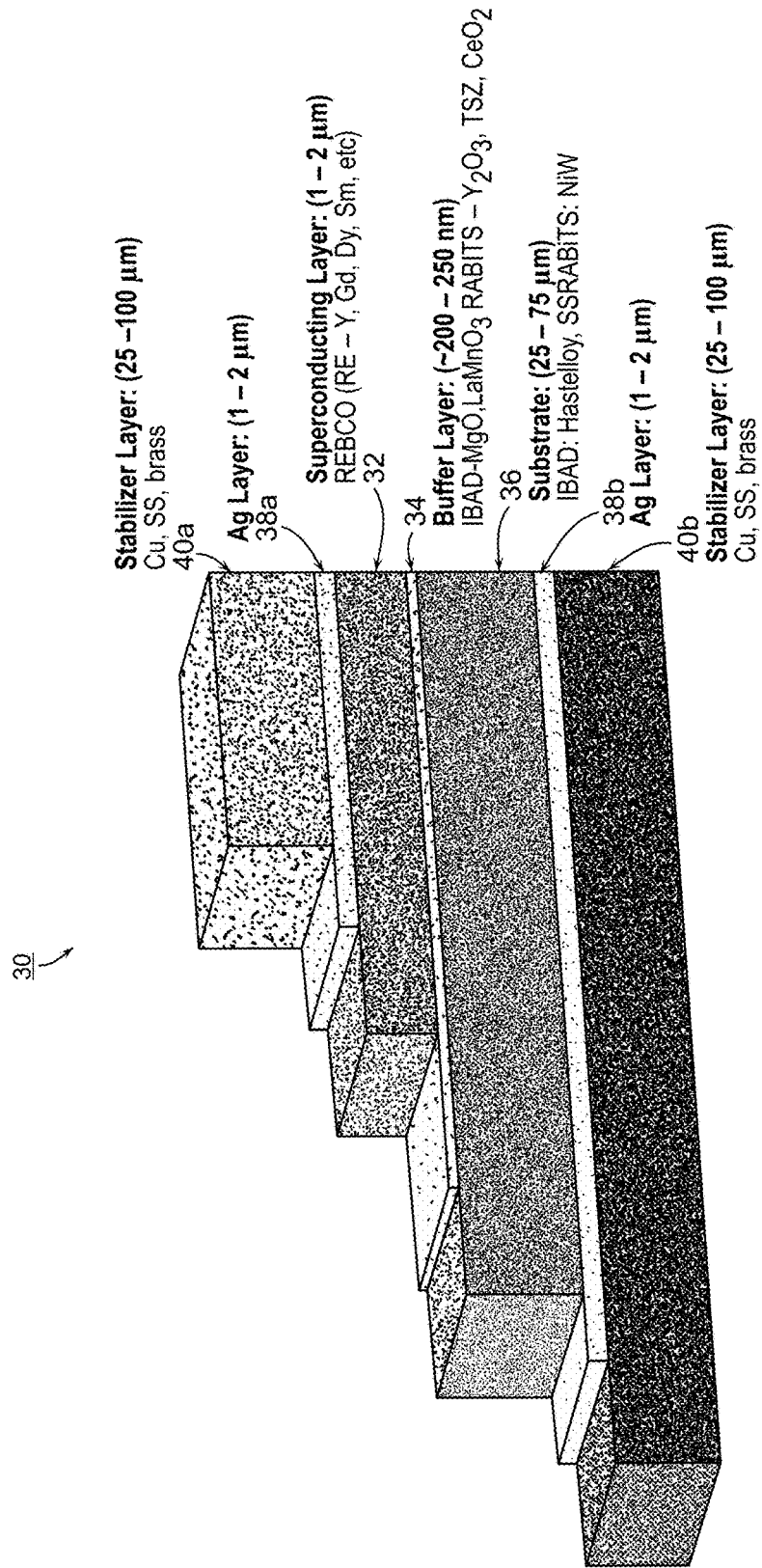
FIG. 2 shows the basic architecture of a typical HTS wire which may be used in with the irradiation process according to this invention.

An exemplary architecture of an HTS wire 30 which may utilize the ion irradiation process according to this invention is depicted in FIG. 2. In this architecture, HTS wire 30 includes a polycrystalline superconductor layer 32 disposed over and supported by a substrate 36, between which are one or more buffer layers 34. The substrate 36 comprises a flexible metal foil which may be formed of any suitable metal containing material. According to one embodiment, the flexible metal substrate is a nickel containing alloy.

The substrate 36 may include texture that is transferred to the superconductor layer 32. As described herein, texture refers to a microstructure including crystal plane alignment. A high degree of crystal plane alignment in the superconductor layer allows the polycrystalline superconductor layer 32 to exhibit single crystal-like performance. The textured substrate may be the flexible metal film or one of the other layers described above. Alternatively, the textured substrate 36 may be a separate layer within the coated conductor.

The textured substrate 36 may be produced by any appropriate process. According to one embodiment, the textured substrate 36 may be produced by a rolling-assisted biaxially textured substrate (RABiTS) process. The RABiTS process includes the production of a biaxially textured metal foil by a rolling assisted process. At least one oxide buffer layer 34 is then provided on the textured metal substrate 36, with the oxide buffer layer exhibiting the same biaxially textured microstructure as the metal film. A biaxially textured high temperature superconductor layer 32 is then deposited over the oxide buffer layer(s) 34. The oxide buffer layer 34 prevents the diffusion of metal from the film to the superconductor layer.

As is known in the field, HTS wire 30 also may include a metallic protective layer 38a, such as an Ag layer, disposed on superconductor layer 32 and a stabilizer layer 40a disposed on the metallic layer 38a. Another metallic layer 38b and stabilizer layer 40b may be disposed on the opposite side of the HTS wire 30, attached to the substrate 36.

According to another embodiment, the textured substrate may be produced by a process utilizing ion-beam assisted deposition (IBAD). The IBAD process includes the ion-beam assisted deposition of a textured ceramic buffer layer on the surface of an un-textured metal foil. A superconductor layer is then deposited over the textured ceramic buffer layer. Additional buffer layers may be provided between the textured ceramic buffer layer and the superconductor layer and/or between the metal film and the textured ceramic buffer layer. The IBAD coated conductor includes a metal film substrate, a textured ceramic oxide buffer layer, oxide buffer layers, a superconductor layer, a metallic protective layer and a stabilizer layer.

It is understood that other methods or materials can be used to construct similar tapes and that they can also be used in accordance with this invention.

The superconductor layer may be deposited over the substrate of the coated conductor structure by any suitable process. According to one embodiment, the superconductor layer may be deposited by a metal-organic deposition process. According to another embodiment, the superconductor layer may be deposited by a pulsed laser deposition (PLD), reactive co-evaporation (RCE), metal-organic chemical vapor deposition (MOCVD), electron beam deposition, chemical vapor deposition (CVD), or sputtering process. The superconductor layer may have any appropriate thickness. According to one embodiment, the superconductor layer has a thickness greater than 1 µm. In another embodiment, the superconductor layer has a thickness in the range of about 1 µm to about 2 µm. According to some embodiments, the superconductor may have a thickness of less than about 5 µm.

A protective metal layer may be deposited over the superconductor layer of the superconducting tape for the purposes of protecting the superconductor layer. The protective metal layer may be any suitable metal containing material. According to one embodiment, the protective metal layer is a silver layer. The protective layer may have any appropriate thickness. According to one embodiment, the protective layer has a thickness of 3 µm. According to another embodiment the protective layer has a thickness of about 1 µm.

A stabilizer layer may be deposited over the protective metal layer. According to one embodiment the stabilizer layer may include copper. The stabilizer layer may have a thickness greater than 10 µm. In another embodiment the stabilizer layer may have a thickness of 1 to 2 µm. In one embodiment, the stabilizer layer may be added after the superconductor layer is irradiated.

The superconductor layer may be formed of any appropriate superconductor. According to one embodiment the superconductor layer may be a rare earth metal-alkaline earth metal-transition metal-oxide superconductor. According to one embodiment, the superconductor layer may contain a superconductor with the general formula:

$$(RE)Ba_2Cu_3O_{7-\delta}$$

where RE includes at least one rare earth metal and $0 \leq \delta \leq 0.65$. According to another embodiment, the superconductor layer may contain a superconductor with the general formula:

$$(RE)Ba_2Cu_3O_7$$

where RE includes at least one rare earth metal. In one embodiment, RE may include yttrium, producing a superconductor layer of the general formula $YBa_2Cu_3O_7$ (YBCO). While the superconductor layer will be referred to herein as a YBCO superconductor layer for the purposes of convenience, the methods discussed in this application apply equally to other appropriate superconductor materials. In some cases, RE may be a mixture of two or more rare earth metals.

The superconductor layer may also include a dopant in addition to the primary rare earth metal. The dopant may be a rare earth metal. According to one embodiment, a YBCO superconductor layer may include a dysprosium dopant. The dopant may be present in an amount of up to 75% relative to the primary rare earth metal. According to one embodiment, the dopant is present in an amount of at least about 1% and at most about 50% of the primary rare earth metal.

According to another embodiment the dopant may be a transition metal such as Zr, Nb, Ta, Hf or Au. The dopant may combine with other elements in the superconductor to form a single or mixed metal oxide.

In one embodiment, the superconducting tape may be sectioned along its length in to multiple strips. The sectioning can be done by any appropriate means including laser cutting, roll slitting or punching. An additional metallic stabilizer layer may be may be laminated to both surfaces of the sectioned tape to form a superconducting wire. The stabilizer layer can be any suitable metal containing material. In one embodiment the stabilizer layer is copper. In other embodiments, the stabilizer layer is stainless steel, brass or any other suitable metal containing material. In one embodiment, the width of the stabilizer is the same as that of the sectioned tape. In another embodiment, the width of the stabilizer layer is greater than that of the sectioned tape. In another embodiment, the stabilizer layer can wrap around all sides of the sectioned tape. In another embodiment, two or more sectioned tapes may be joined between the stabilizer layers. In a preferred embodiment the stabilizer layers are bonded to the to the sectioned insert strip with solder.

Figure 3:
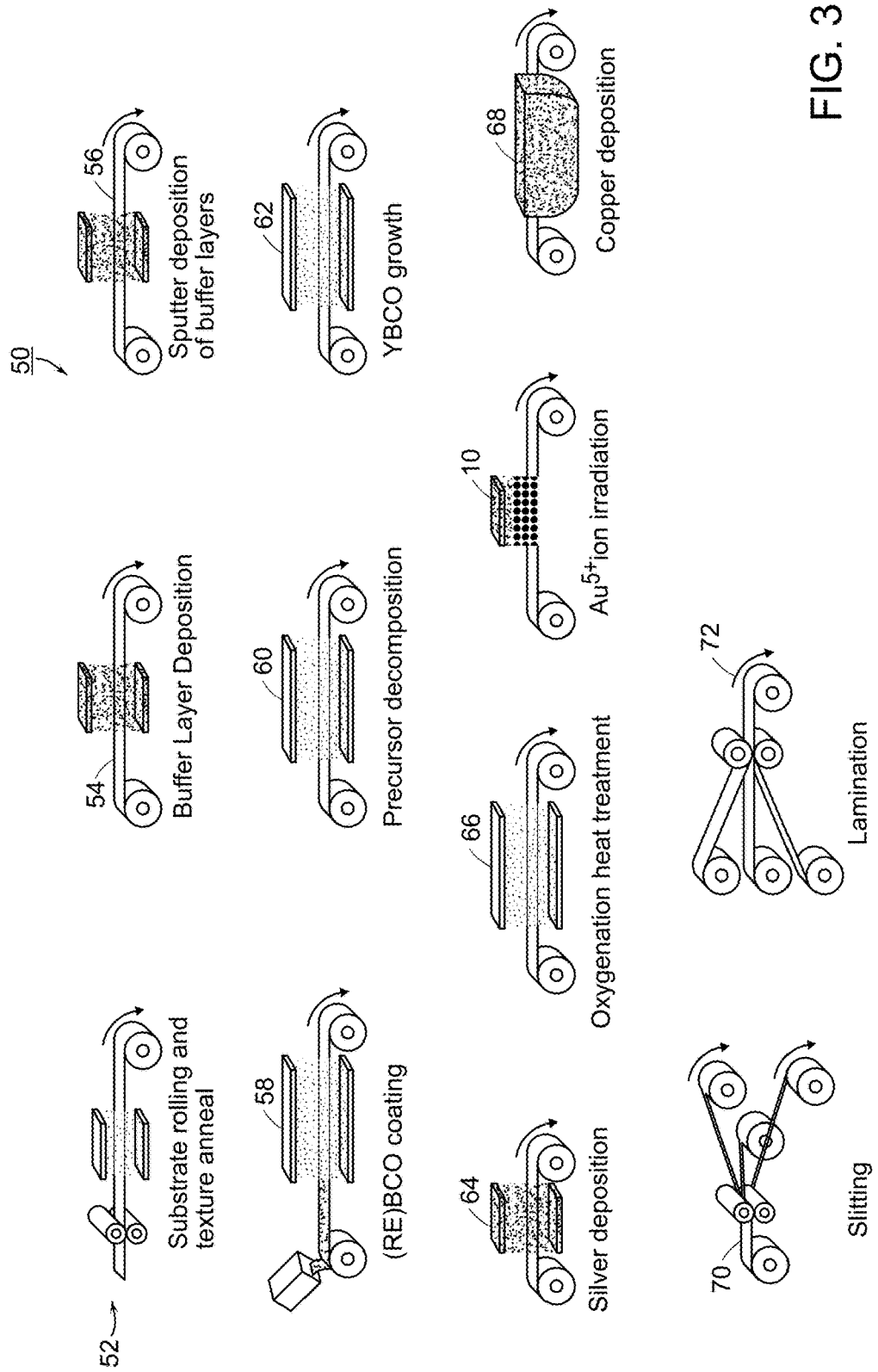
FIG. 3 illustrates a roll-to-roll process for manufacturing the 2G HTS wire of FIG. 2 by the RABiTS/MOD process with insertion of roll-to-roll particle beam irradiation.

FIG. 3 illustrates the basic roll-to-roll manufacturing process 50 for producing a superconducting wire, using the RABiTS process for the template and MOD process for the YBCO layer, with a uniform dispersion of particle irradiation induced pinning defects along its length and width. The process includes substrate rolling and texture annealing at process step 52, buffer layer deposition and sputter buffer deposition of buffer layers are steps 54 and 56, respectively. At steps 50, 60 and 62 the HTS layer is deposited by coating the buffered substrate with a solution based (RE)BCO precursor, the precursor is decomposed and the (RE)BCO layer is grown. Next, at step 64 an Ag protective layer is deposited on the HTS layer and at step 66 there is an oxygenation heat treatment performed. In the standard process, the next step in the process would be the deposition of a stabilizer layer, such as a copper stabilizer, a step 68, followed by slitting and laminations at steps 70 and 72, respectively. However, with the present invention an ion irradiation step, such as 10, FIG. 1, is inserted between oxygenation heat treatment step 66 and the stabilizer deposition step 68.

It is understood that individual process steps depicted in FIG. 3 can be replaced when other processes are used for the template, YBCO deposition, or stabilization. Moreover, the irradiation process may be carried out directly on a surface of the biaxially textured high temperature superconductor layer if a metallic protective layer is not disposed over the biaxially textured high temperature superconductor layer.

In order for the ions to produce the desired defects in the superconductor layer, they must have sufficient energy to pass through any layers (e.g. a protective metal layer) on the surface of the superconducting layer and uniformly into the superconductor layer. Acceptable ion energies can be calculated using programs such as SRIM (Stopping and Range of Ions in Matter). According to one embodiment, ions may be Au ions with energy of about 1 to 25 MeV (medium energy) or more preferably with energy of about 14 to 20 MeV for a YBCO layer with a thickness about 1.2 µm and a protective Ag layer thickness of about 1 µm. In another embodiment where there is no protective metal layer, ions may be Au ions with energy of about 1 to 14 MeV or more preferably with energy of about 7 to 14 MeV for a YBCO layer with a thickness about 1.2 µm.

Figure 4A:
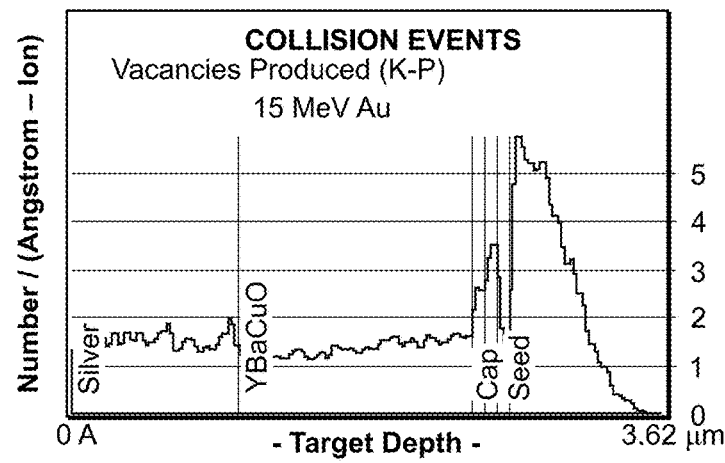
FIGS. 4A-4C are SRIM calculations showing the number of defects formed through the depth of the superconductor layer for 15, 10 and 5 MeV Au particle beams.
Figure 4B:
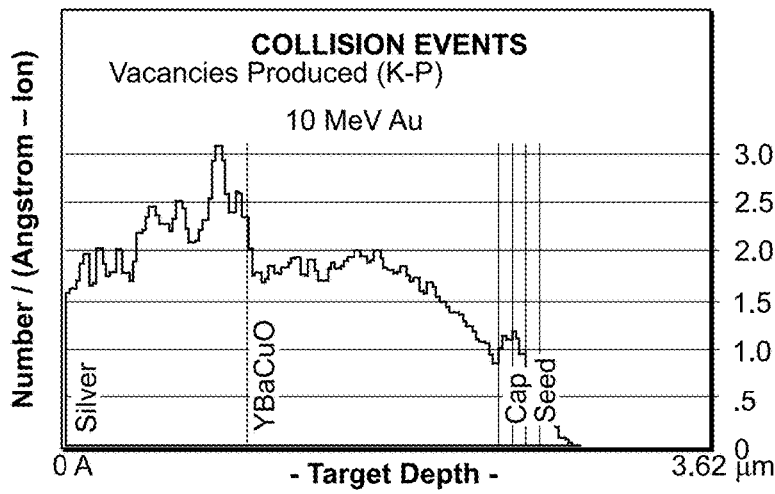
Figure 4C:
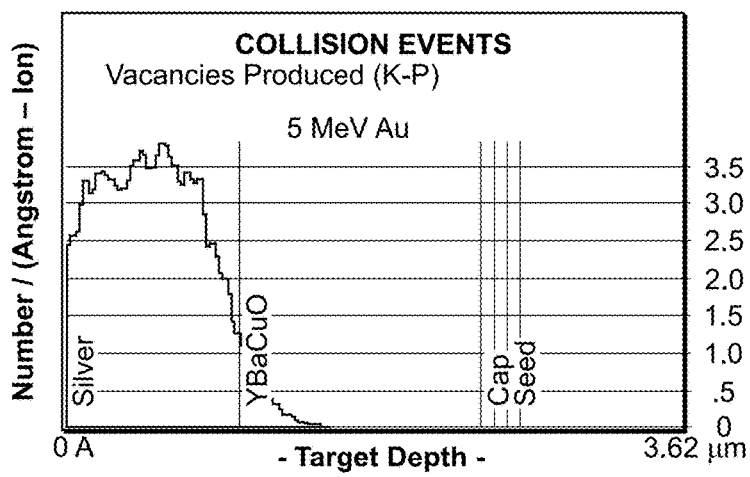

For a YBCO layer with a thickness about 1.2 µm and a protective Ag layer thickness of about 1 µm, in the case that the energy of the ions is too low, e.g. approximately 5 MeV, the ions may not travel far enough into the superconductor layer to produce uniformly distributed randomly dispersed defects as shown in FIG. 4C. As shown in FIG. 4B, at an ion energy of 10 MeV, the distribution across the HTS layer is not uniform as the concentration tails off significantly towards the bottom of the HTS layer. As shown in FIG. 4A, with the ion energy at 15 MeV, there is a uniform ion distribution across the HTS layer. In each case the Ag protective layer thickness was approximately 1 µm.

According to an alternative embodiment, the medium energy ions of other elements such as Ar, W, Ni, Cu, O, Ag, Xe, Pb, H ions may be used to form the randomly dispersed defects continuously along the length and width of a superconducting tape.

The irradiation may be carried out through a metallic protective layer of the HTS wire that is disposed over the biaxially textured high temperature superconductor layer or directly on the biaxially textured high temperature superconductor layer if there is no protective layer provided. In one embodiment the protective metal layer is Ag. According to one embodiment the thickness of the Ag layer is about 0.25 µm to 3 µm or more preferably 0.5 µm to 1 µm.

Figure 5:
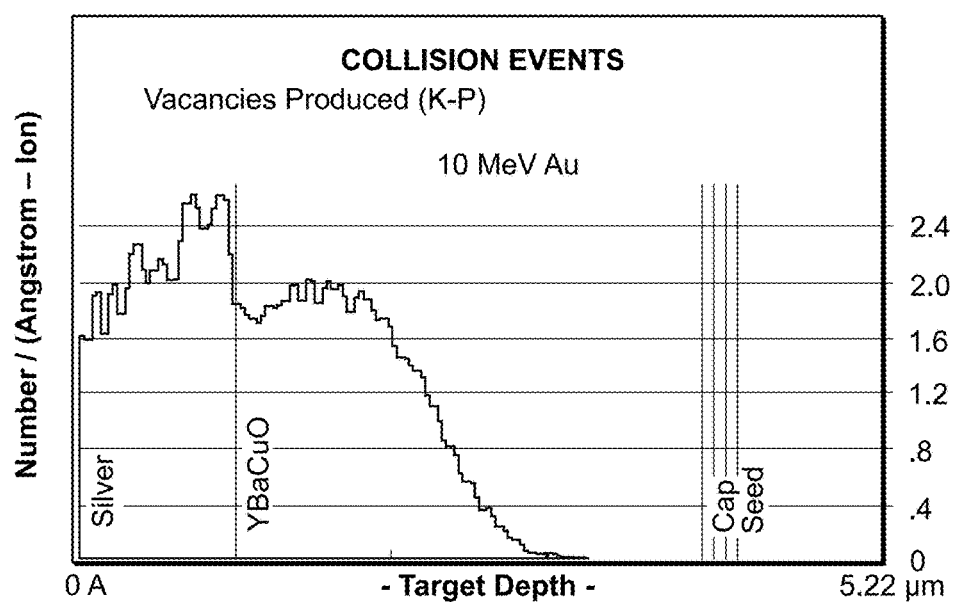
FIG. 5 illustrates the reduced penetration of the 10 MeV Au particle beam into the HTS layer with a 3 micrometer Ag protective layer on the HTS wire surface.

Since the protective metal layer will interact with the impinging particles their penetration depth is reduced as the thickness of the layer increases for a given particle energy. As illustrated in FIG. 5, for a 3 µm thick Ag layer with a 10 MeV Au particle beam the particle concentration falls off rapidly at about one half the depth of the HTS layer and quickly diminishes to zero.

In order to minimize the energy needed to insure a uniform penetration of the particle beam through the underlying HTS layer, the Ag layer preferably has a thickness of 0.5 to 1 µm. This thickness allows the use of lower energy particle beams and still provides protection of the HTS layer from the atmosphere and later processing steps.

Figure 6B:
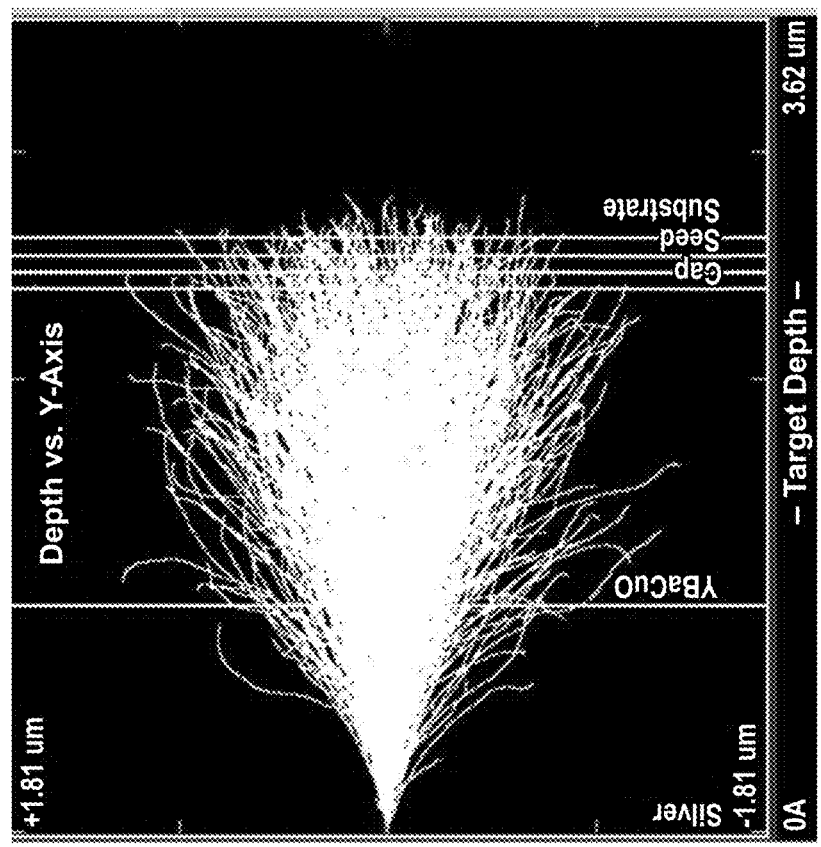
FIG. 6B is a SRIM calculation showing ion depth through thickness of the HTS film of the ion beam of FIG. 6A.
Figure 6A:
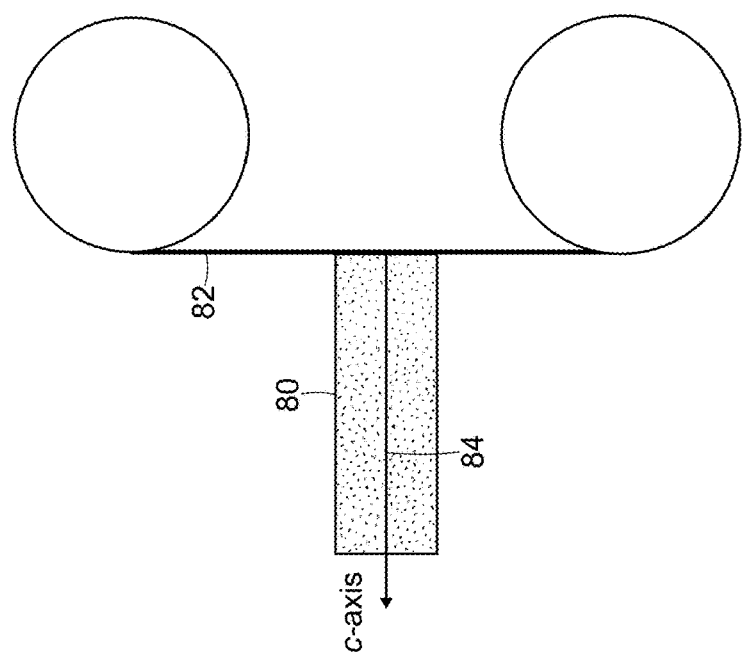
FIG. 6A illustrates an ion beam impinging on an HTS tape parallel to crystallographic c-axis of the HTS tape.

In one embodiment, the irradiation 80 of the HTS layer on the moving HTS tape 82 may take place along the crystallographic c-axis 84 of the superconductor layer as illustrated in FIGS. 6A and B. In this embodiment, when the energy of the ion is properly selected, i.e. 15 MeV, the defect formation is uniform throughout the thickness of the HTS layer as shown at 86.

Figure 7B:
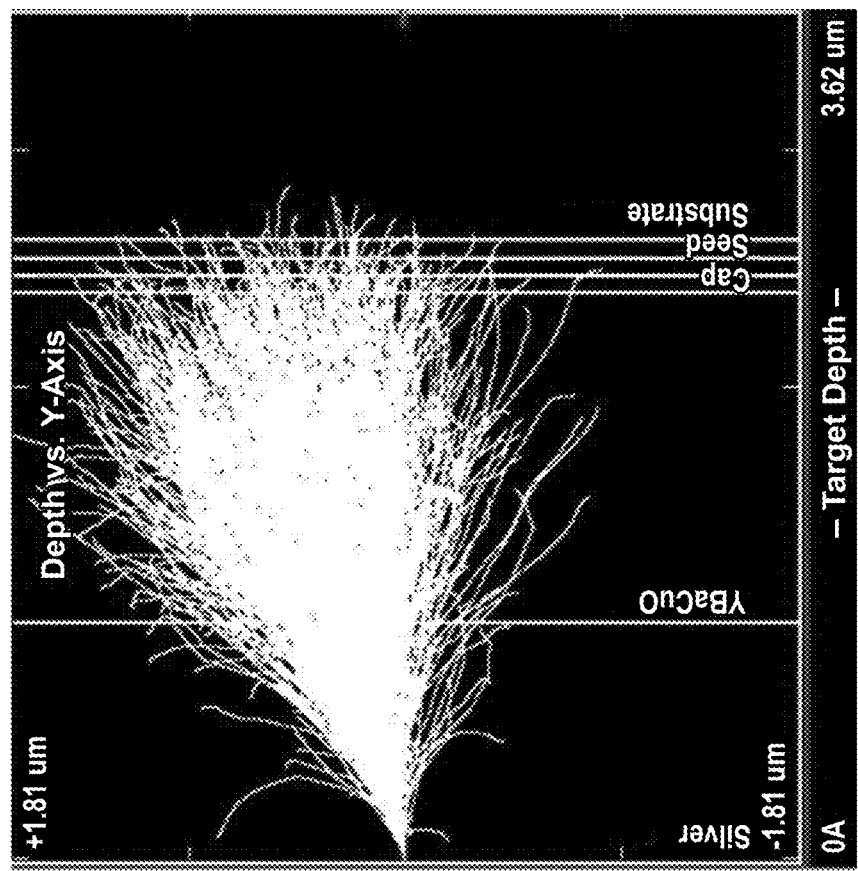
FIG. 7B is a SRIM calculation showing ion depth through thickness of the HTS film of the ion beam of FIG. 7A.
Figure 7A:
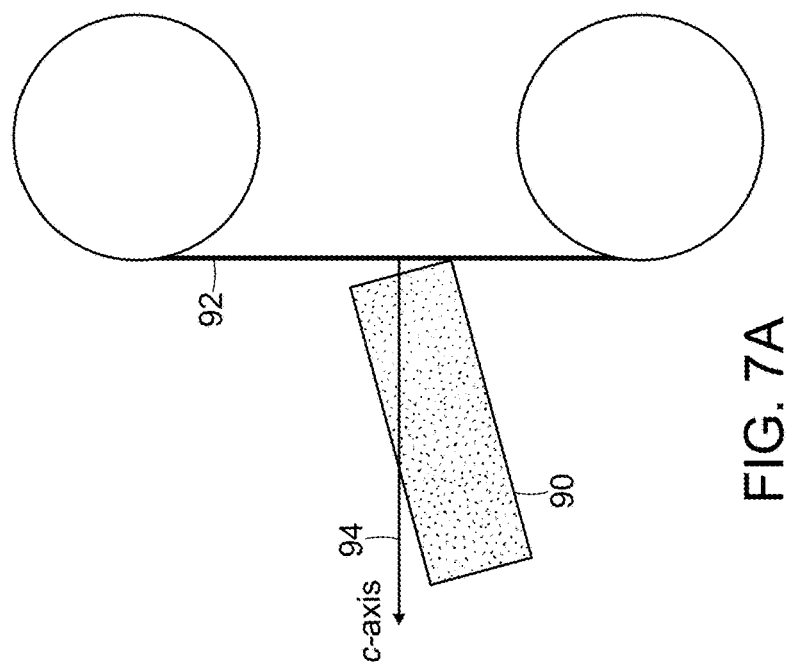
FIG. 7A illustrates an ion beam impinging on an HTS tape at a 10° angle displaced from the crystallographic c-axis of the HTS tape

In an alternative embodiment the irradiation 90 impinging on the moving HTS tape 92 may take place along an angle displaced from the c-axis 94 of the superconductor. In this embodiment, as illustrated in FIGS. 7A and B the path of the ion through the HTS layer increases, in proportion to the angle. Thus, for the same energy, the defect density will decrease along the c-axis 94 of the HTS layer.

Figure 8:
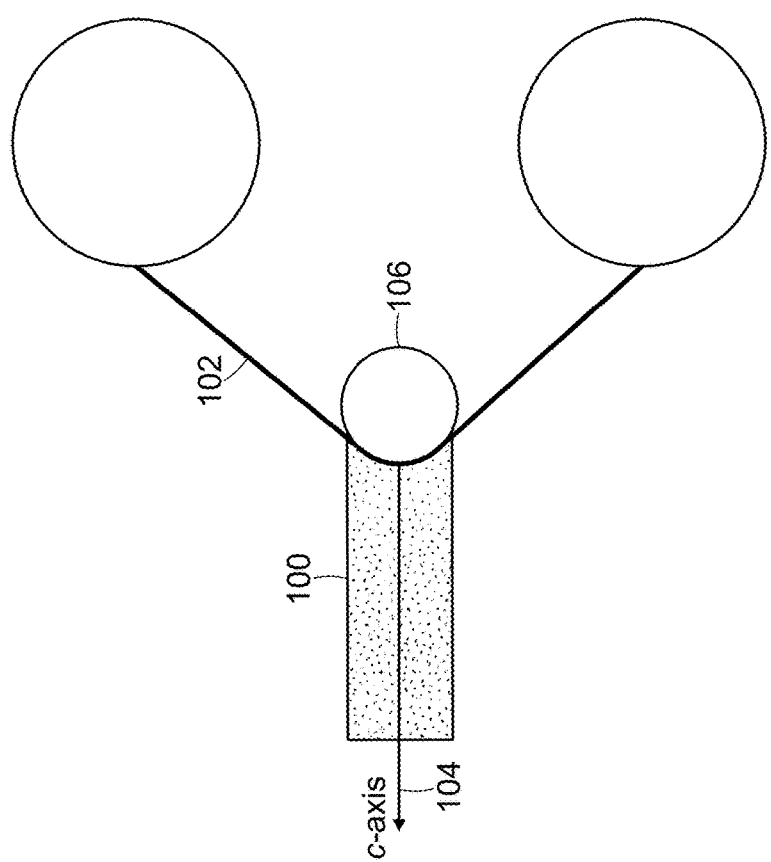
FIG. 8 is an illustration of a nose roller that allows the particle beam to impinge on the HTS tape at a range of angles.

According to another preferred embodiment, the irradiation of the HTS layer on moving tape 102 may be applied at a continuous range of angles about the c-axis 104 of the HTS layer by bending the tape around a nose roller 106 located in the ion beam as illustrated in FIG. 8. In this alternative embodiment, by selecting the diameter of the bend, the penetration depth of the ion beam through the HTS layer can be adjusted at each angle allowing the defect density to be selectively tuned along the depth of the crystallographic c-axis 104 of the superconductor layer.

The dosage of ion particles should be selected such that the density of resulting defects results an increase in the critical current at a desired temperature and field for the intended application. For instance, in the case of HTS wire intended use in HTS coils for motor or generator applications, it is desirable to have the current optimized at around 30K-50K in a magnetic field of 2-4 Tesla. In the case of Au ions, the irradiation fluence may be at least $1 \times 10^{11}$ particles/$cm^2$. According to one embodiment, the irradiation fluence may be in the range of $1 \times 10^{11}$ particles/$cm^2$ to $1 \times 10^{12}$ particles/$cm^2$.

When other ions are used, the preferred range of irradiation fluence may be selected based on the effectiveness, size and microstructure of the defects to enhance the critical current at the desired operating conditions. In general, the number of effective defects depends on the atomic mass of the ions. Thus ions with higher atomic mass generally require less total dosage to achieve the same pinning enhancement than ions with lower atomic mass.

With the process described herein, the defects formed by the ions with energies in the 1-25 MeV range are generally point defects which are uniformly distributed across the width and length and through the depth of the superconductor layer and which have uniform dimensions of <20 nm and preferably <10 nm. More specifically, what is meant by uniform dimensions is that over any given volume of the superconductor layer made according to this invention at least ninety percent (90%) of point defects will have dimensions of <20 nm and preferably <10 nm.

Existing chemical techniques for producing vortex pinning microstructures in the superconductor layer do not produce uniformly sized defects. The defects produced are varied and can be from 10 nm to 200 nm in size. The uniformity in defect size achieved through the ion radiation approach described herein results in improved current carrying performance in the superconductor layer.

In certain applications, larger point defects (e.g. 2 to 3 times the size) may be desired and this can be achieved by heating the superconductor layer in which small point defects according to this invention have been or are being formed to temperatures of about 100 to 300° C. during or after the irradiation. This causes the point defects to combine to form larger cluster defects. If the superconductor layer is heated substantially above 300° C., the defects can be annealed away reducing their ability to increase the critical current as selected temperatures and fields.

In one embodiment, optimal pinning enhancement may be achieved with an irradiation fluence of range of $1 \times 10^{13}$ to $10 \times 10^{13}$ particles/$cm^2$ when O ions are used. In an alternate embodiment, preferred range of irradiation fluence may be in the range of $2 \times 10^{16}$ to $10 \times 10^{16}$ particles/$cm^2$ when H ions are used.

The particle beam currents employed in the irradiation process may be any appropriate amount that generates a sufficient number of defects without heating the tape to temperatures above about 300° C. during the irradiation process. In one embodiment it is desirable that the particle beam current is as high as possible. In general, the higher the particle current the more defects are formed in a given volume of the superconductor for a set time. Thus in the case of a moving tape, higher particle currents allow higher tape transport speeds. In a preferred embodiment the particle beam current is selected to maintain the tape at a temperature below 200° C. In one embodiment, if the particle current causes the HTS layer to exceed 200° C., the moving tape can be actively cooled to maintain the temperature below 200° C.

In one embodiment the particle beam is generated using a sputtering process to generate the atoms that are then accelerated to the desired voltage by use of an accelerator. In another embodiment, the ions are generated from a gaseous source. In a preferred embodiment the ions are generated using an ECR source (Electron Cyclotron Resonance Ion Source). The advantages of the ECR sources are reliability and ability to produce high current of multiple ionized chemical species. ECR sources are can produce ion beams with high charge states (higher than 5+) of elements with high atomic mass, such as Au, W, Kr, Ar etc. The acceleration of the ions can be achieved by use of a Van de Graff generator or a tandem Van de Graff generator which can generate voltages in the tens of MV range. Magnets in the accelerator system can be used to isolate ions with different charge states. The energy of the ion is determined by the relationship, $E_{(ion)} = (1+g)$ eV, where g is the charge state of the ion. In general, the charge state of the ion is selected based on the available terminal voltage of the accelerator and, the necessary particle energy needed to fully irradiate the superconductor layer and desired particle current.

In a preferred embodiment, the ions are accelerated using a Pellerton charging chain to a voltage of 1-25 MeV. The advantage of this system is that it is more stable and compact than the Van de Graff or tandem accelerators.

In a preferred embodiment, ions with a charge state of 5+ are used with an accelerating voltage of 3 MeV, providing a particle energy of 15 MeV. In another embodiment, an accelerating voltage of 5 MeV can be applied to ions with a 3+ charge state, generating a particle energy of 15 MeV. Other combinations of accelerating energies and particle charges can be used to achieve the desired energies and particle currents.

Since the defect density affects the flux pinning and thus the critical current density at a given temperature and applied field, it is important that the moving tape is uniformly exposed to the particle beam. In one embodiment, the particle beam is shaped into a rectangular pattern with an aspect ratio of between 1.1:1 to 10:1 or 20:1. The longest edge can be oriented perpendicular to the tape movement if the beam is wider than the moving tape by a factor of 2 or more. In a preferred embodiment, the long direction of the rectangular beam is oriented parallel to the tape movement direction and is rastered across the width of the moving tape. The width of the tape may be 1 cm or more preferably between 40 to 200 mm. The particle beam can be rastered at a rate of 0 to 100 kHz and traverse a distance of 1-10 cm greater than the tape width. In a preferred embodiment, the particle beam dimensions, the raster rate of the particle beam, the movement of the particle beam, the superconductor tape width and the tape speed through the particle beam are selected to insure that the particle flux is uniform across the tape length and width.

In one embodiment, the tape can be passed through a particle beam multiple times to achieve the desired dose. In a preferred embodiment, the desired dose is achieved with one pass through the particle beam. In an alternate embodiment, the tape is passed through particle beams with different ions or the same ion with different energies in order to produce different pinning structures or to optimize the pinning at different temperatures and magnetic fields. In one embodiment, the tape can be passed through a particle beam with 15 MeV Au ions and through a second beam of 250

MeV Au ions to produce a combination of point defects from the lower energy particle beam and correlated defects from the higher energy beam.

In one embodiment, the tape can be sectioned along its length after the irradiation process and the individual strips laminated between two metal strips to form a composite superconducting wire.

In another embodiment, a copper layer is electroplated on the surface of the Ag after the irradiation is complete. The copper can be deposited directly on the Ag layer by a standard electroplating process using a sulfuric acid based copper plating solution. In one embodiment the copper is deposited on the HTS side of the tape. In a preferred embodiment, the copper is deposited both on the surface of the HTS and the back side of the substrate. In one embodiment, the thickness of the copper layer is in the range of 0.5 to 20 µm. In a preferred embodiment, the copper thickness is in the range of 0.5 to 2 µm. In one embodiment, the copper plated tape can be sectioned along its length and the individual strips laminated between two metal strips to form a composite superconducting wire.

The roll-to-roll irradiation process allows the uniform addition of randomly dispersed defects to a superconductor with a pre-existing defect structure. This combination of defect structures in the superconductor layer may allow for synergistic improvement in the pinning of enhancement in the superconductor layer. The irradiation process may be employed to treat production-line YBCO coated conductors in a continuous process. According to one embodiment, the irradiation process may be a continuous process utilizing a roll-to-roll or reel-to-reel system.

The increased critical currents of the HTS wires produced as a result of the irradiation process render them especially suitable for use in applications subject to an applied magnetic field. The irradiated coated conductors may be employed in motors, transformers, generators, high field magnetics, and solenoids.

EXAMPLES

A high temperature superconducting (HTS) wire containing a uniform dispersion of random point defects along the entire length and width and a method for introducing these defects by a roll-to-roll process are described. The point defects can be introduced into the fully formed HTS layer by exposing the HTS layer to an ion beam of a specific composition, energy and particle current as the wire is moved from one a first reel to a second reel. The HTS wire made in accordance with certain embodiments can carry a significantly larger critical current, over its entire length and width, in the presence of magnetic fields of approximately 1 T and greater that are oriented primarily along the c-axis of the superconductor.

In the following detailed description, reference is made to the accompanying drawings, which form a part thereof. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present invention, as generally described herein, and illustrated in the figures, can be arranged, substituted, combined, and designed in a wide variety of different configurations, all of which are explicitly contemplated and made part of this disclosure.

Example 1

Figure 9:
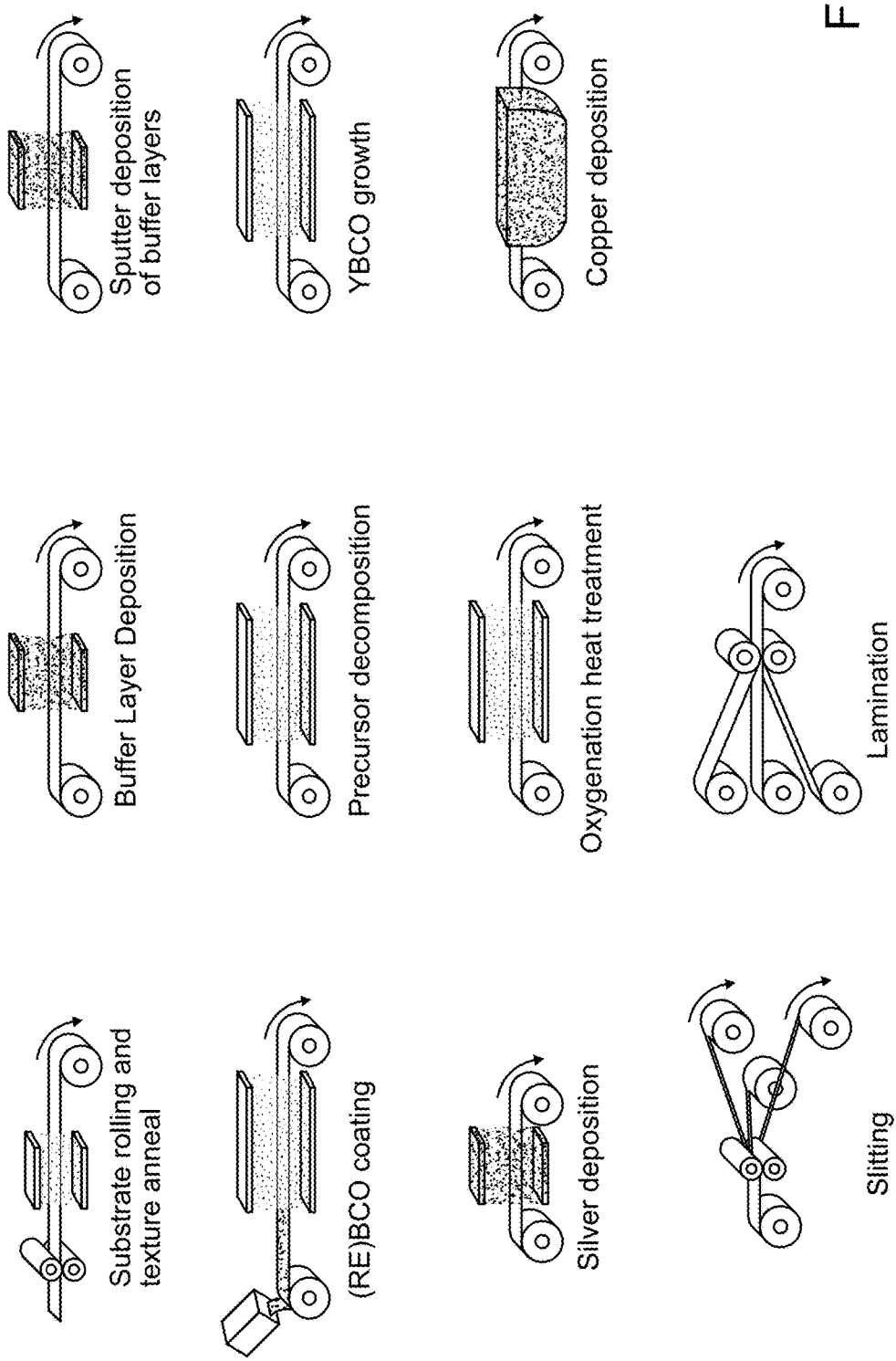
FIG. 9 illustrates a roll-to-roll process for manufacturing 2G HTS wire by the RABiTS/MOD process.

Continuous lengths of HTS insert strip, with a width of 46 mm, were produced with a Y(Dy)BCO film deposited by metal-organic deposition onto rolling assisted biaxially textured substrates as illustrated in FIG. 9. The $YBa_2Cu_3O_{7-\delta}$ superconducting layer was Dy-doped and had a nominal thickness of 1.2 µm, calculated on the basis of a YBCO coating of 7200 mg/cm$^2$ and excluding porosity and $Dy_2O_3$. The bi-axially textured substrate consisted of a 75 µm thick Ni (5 at %)W alloy with 75 nm thick epitaxial layers of $Y_2O_3$, YSZ, and $CeO_2$ on its surface. A silver layer of approximately 1-2 µm thickness was deposited on HTS surface and backside of the substrate. The sample was then oxygenated at a temperature ≥400° C. and a ~1 µm thick copper layer was deposited on both surfaces. All process steps were carried out using roll-to-roll manufacturing processes.

The 46 mm wide HTS insert strip was roll-roll-slit along its length into multiple strips with widths of 4 mm or 10 mm. Short samples were cut from these strips to measure the critical current. The 4 mm of 10 mm strips were laminated between two copper strips to form the standard composite HTS wire.

Example 2

Figure 10:
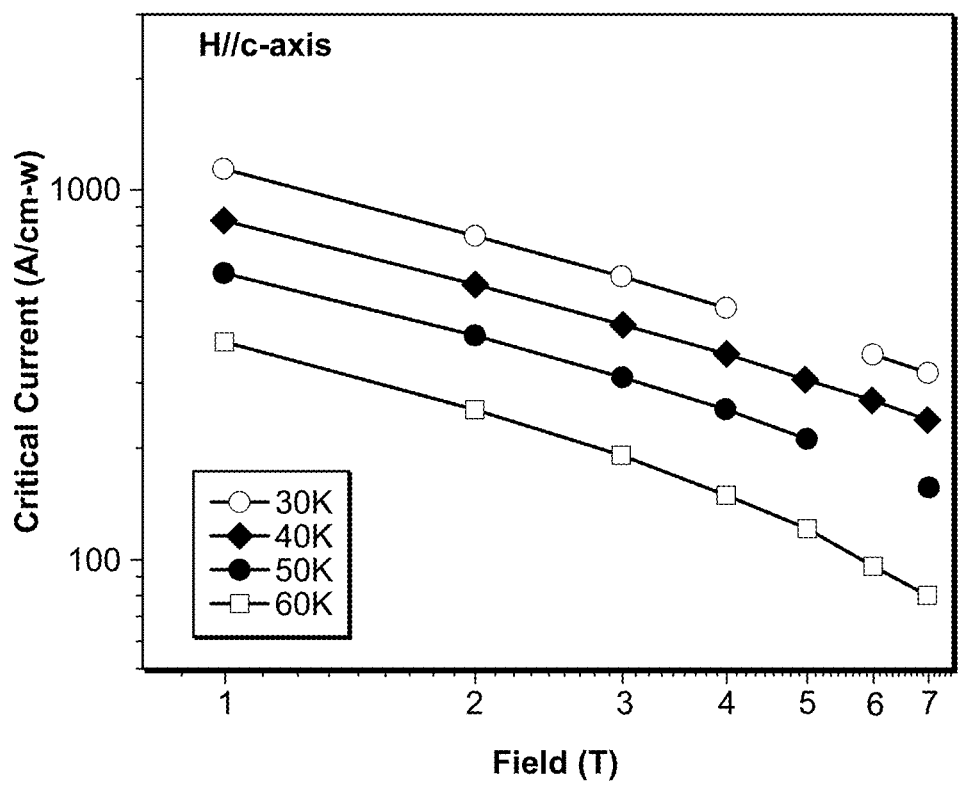
FIG. 10 shows the critical current of a standard HTS wire made from a 46 mm wide insert strip, as described in Example 1, as a function of temperature in an applied magnetic field oriented perpendicular to the crystallographic c-axis of the YBCO.
Figure 11:
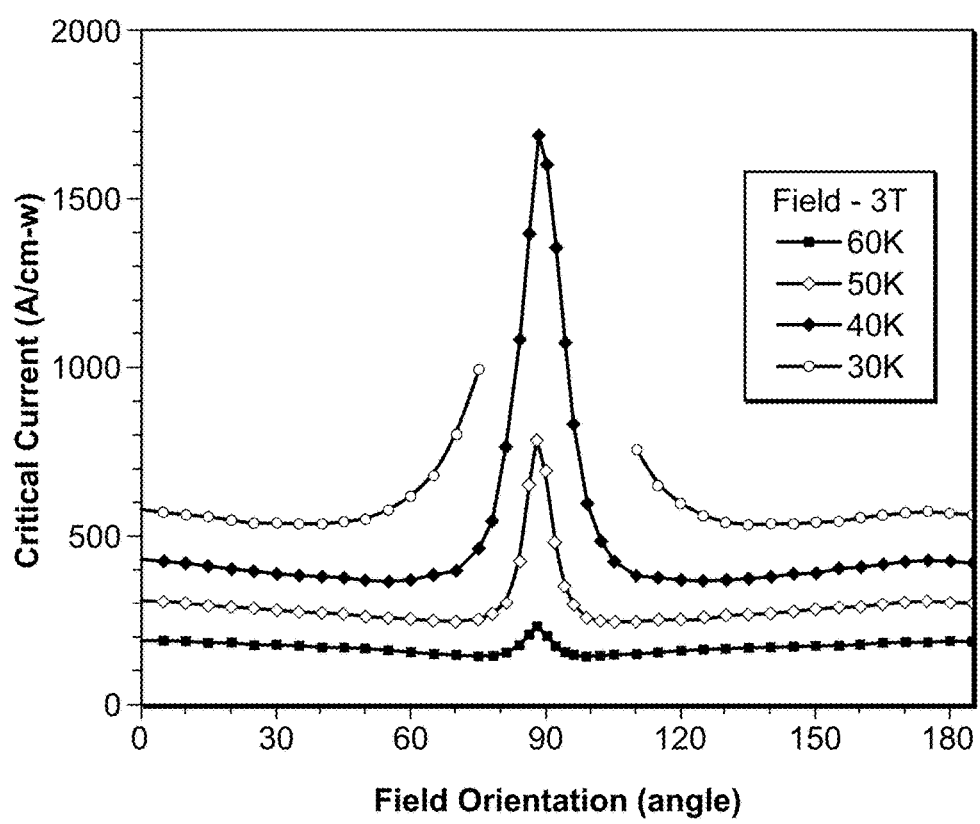
FIG. 11 shows the critical current of a standard HTS wire made from a 46 mm wide insert strip, as described in Example 1, as a function of temperature and applied magnetic field orientation.

The transport critical current of a wire prepared as described in Example 1 was measured as a function of temperature and applied magnetic field. FIG. 10 shows the critical current as a function of temperature when the applied magnetic field is oriented perpendicular to the surface of the taped shaped wire. FIG. 11 shows the transport current as a function of the orientation of the applied magnetic field at multiple temperatures.

Example 3

A HTS wire was prepared as described in Example 1 except that after the slitting process to a 10 mm wide strip, a short coupon (~1×2 cm) was exposed to a 18 MeV $Au^{5+}$ ion beam. The sample was kept in the $Au^{5+}$ beam for sufficient time to achieve a dosage of $6 \times 10^{11}$ ions/cm$^2$. A separate meter long section of the same 10 mm strip was passed through the same static $Au^{5+}$ beam by transporting it from a first roll to a second roll. The speed that the tape was transported from the first roll to the second roll was adjusted such that the dosage of the moving tape was equivalent to $6 \times 10^{11}$ ions/cm$^2$.

Figure 12B:
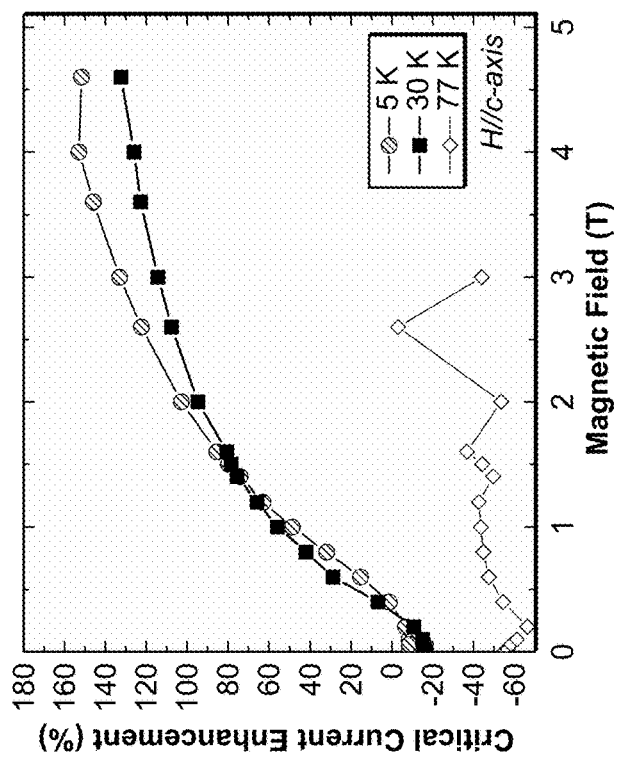
FIGS. 12A and 12B depict the improvement in critical current at about 30K as function of magnetic field for HTS samples for static (FIG. 12A) and moving irradiation (FIG. 12B) under same conditions relative to un-irradiated sample.
Figure 12A:
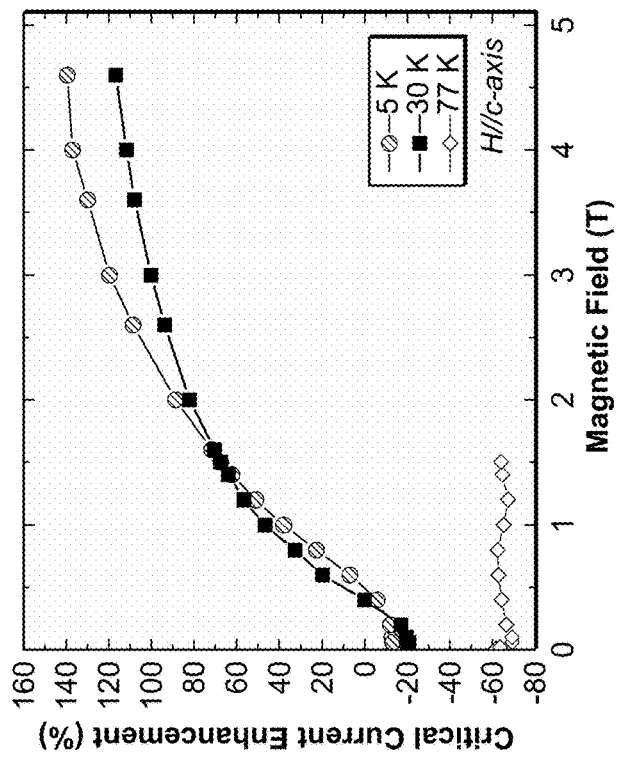

After the irradiation of the static and moving samples, the critical current of the samples was measured by a magnetization technique and compared to the critical current of the sample that was not exposed to the 18 MeV $Au^{5+}$ irradiation. FIGS. 12A and B show the critical current of the static and moving sample at about 30K as a function of the magnetic field oriented perpendicular to the crystallographic c-axis of the YBCO, relative to the un-irradiated sample, were essentially identical.

Example 4

A HTS wire was prepared as described in Example 1 except that after the oxygenation process, the 46 mm strip was passed, using a roll-to-roll process through a beam of $Au^{5+}$ ions with an energy having an energy of 18 MeV as shown in FIG. 3. The particle current of the beam was 148 nA. The Au beam had dimensions of approximately 1×3.4 cm and was continuously rastered at a rate of 1 kHz across the width of the 46 mm strip. To insure the entire width of the 46 mm strip was uniformly exposed to the $Au^{5+}$ beam, the rastering covered a width of 65 mm.

The speed of the tape, moving from one roll to the other, was changed from 28.8 m/hr to 6 m/hr. Between each of the speed changes, the $Au^{5+}$ beam was blocked so that no $Au^{5+}$ ions reached the tape.

Example 5

Figure 13:
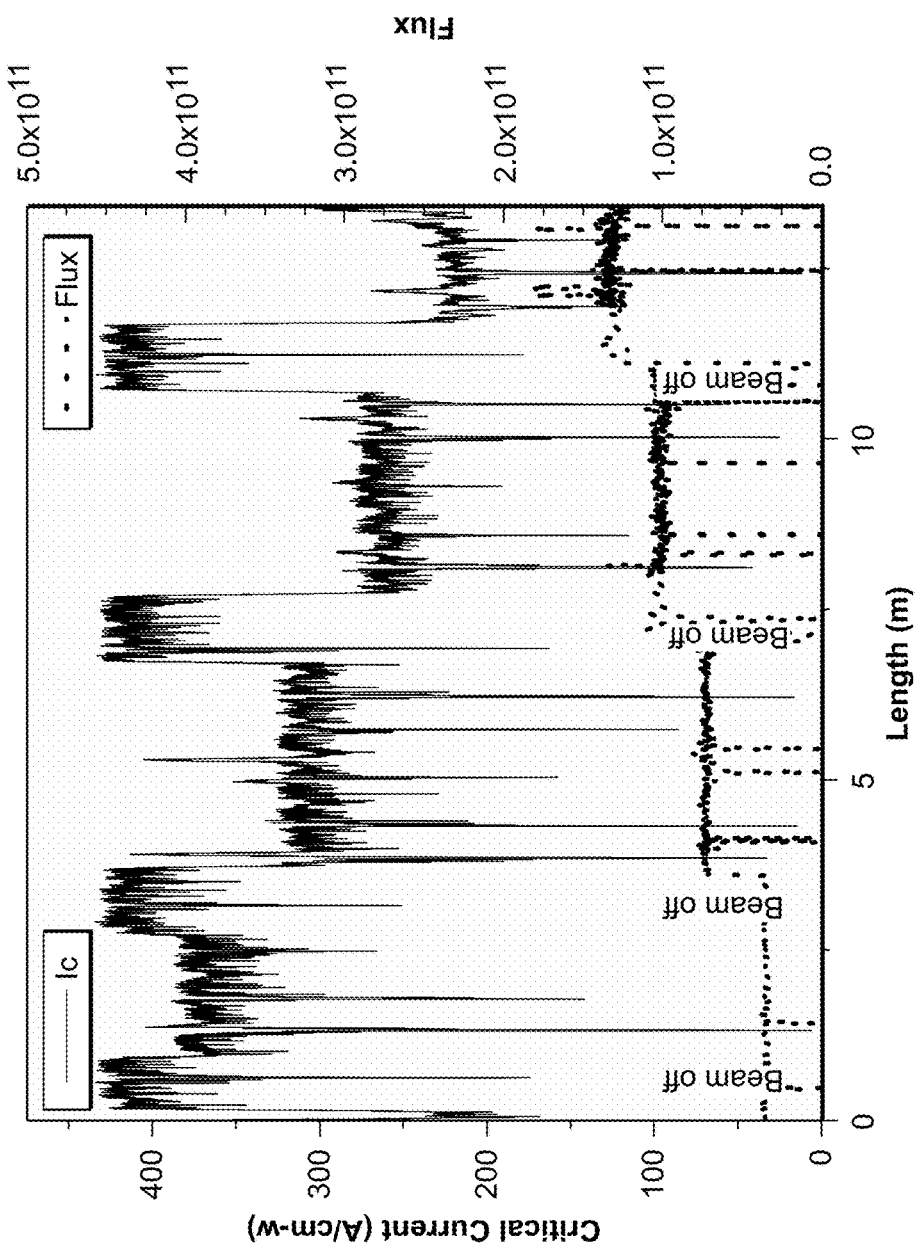
FIG. 13 shows the ion flux as a function of tape length during roll-to-roll irradiation and the 77K self-field Ic along length.

The 77K critical current, in self-field, was measured using a TapeStar instrument along the length of a tape prepared as described in Example 4. FIG. 13 shows the critical current measured along the length along with the corresponding ion flux during the roll-to-roll irradiation process. The critical current shows a decrease in value each time the total dose of $Au^{5+}$ ions is increased relative to the un-irradiated sections.

Figure 14:
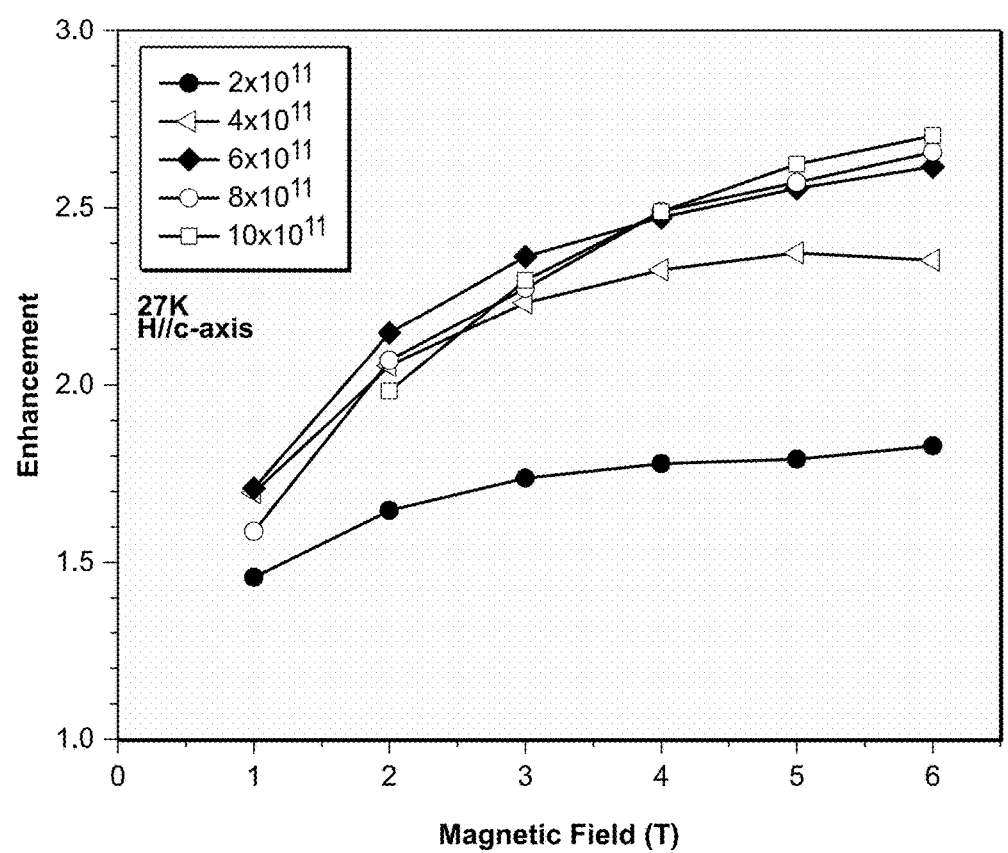
FIG. 14 shows enhancement (relative to un-irradiated sample) of critical current at 27K as function of applied magnetic field oriented perpendicular to the crystallographic c-axis of the YBCO layer for different dosages of $Au^{5+}$ ions.
Figure 15:
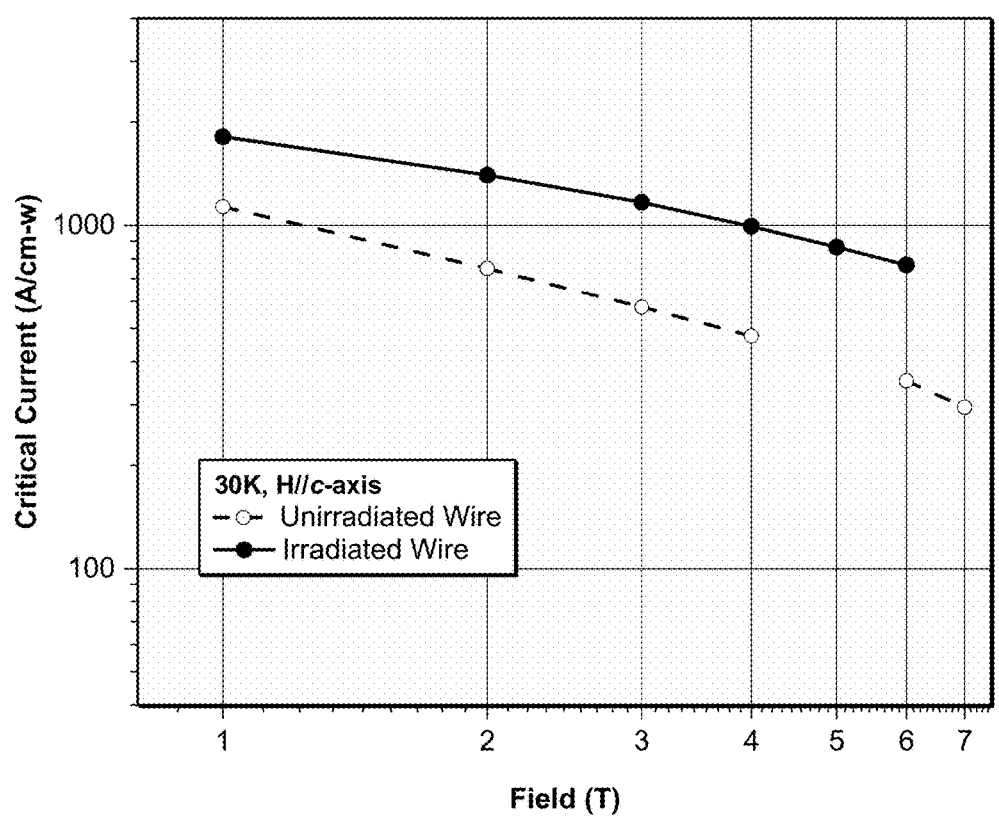
FIG. 15 shows the critical current of a wire irradiated with Au ions and an un-irradiated wire at about 30K as a function of applied magnetic field oriented perpendicular to the HTS wire surface.

The transport critical current of the wire was measured at about 30K as a function the of magnetic field applied perpendicular to the tape surface. FIG. 14 shows the critical current of the irradiated sections of the wire relative to the un-irradiated sections. A maximum enhancement in the critical current was measured for the section exposed to a total dose of $\sim 6\times 10^{11}$ Au ions/cm$^2$.

A comparison of the enhancement in critical current measured at about 30K in a magnetic field oriented perpendicular to the crystallographic c-axis of the YBCO layer as a function of the irradiation dose in FIG. 14 and the 77K, self-field critical current as a function of the irradiation dose in FIG. 13 shows a correlation between the Ic enhancement and 77K, self-field Ic.

Example 6

Figure 16:
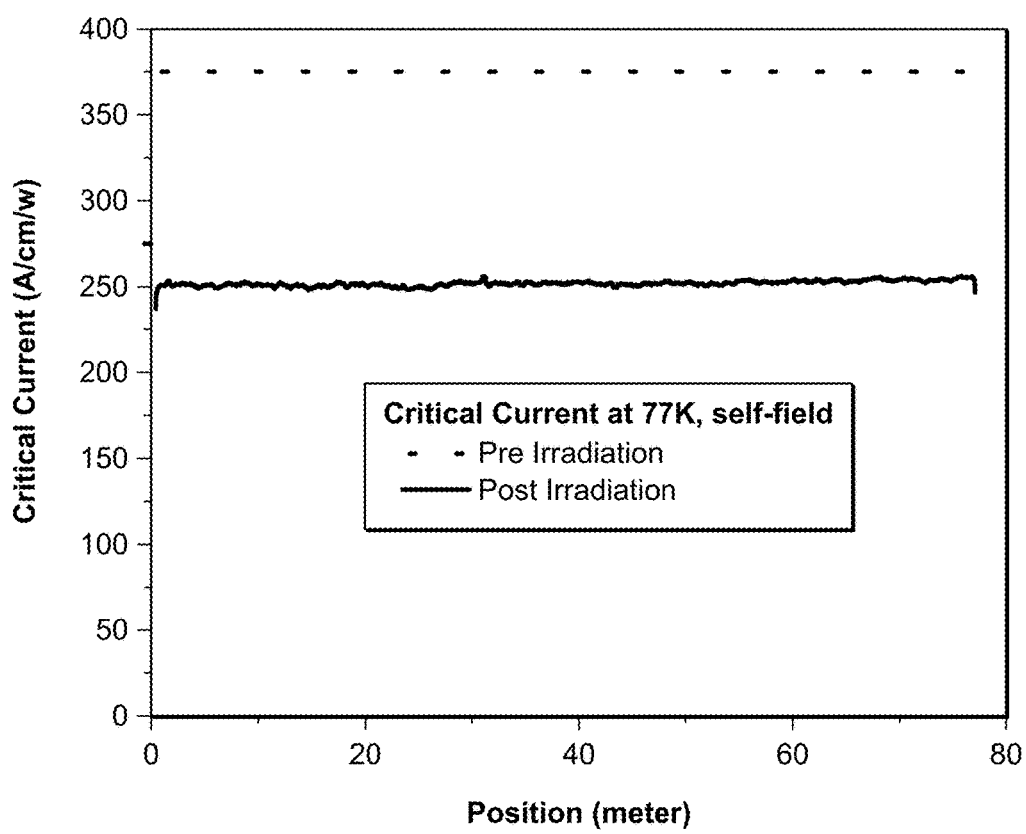
FIG. 16 shows the critical current, measured at 77K, self-field, of a 4 mm wire slit from an 80 meter long, 46 mm wide insert after irradiation with 18 MeV $Au^{5+}$ ions to a dose of $6 \times 10^{11}$ ions/cm$^2$ in a roll-to-roll process compared to critical current measured at 77K, self-field on a section of the 80 meter strip before irradiation.

An approximately 80 meter length of 46 mm insert strip, prepared as described in Example 4, was irradiated with a beam of $Au^{5+}$ ions having an energy of 18 MeV to a dosage of $6\times 10^{11}$ Au/cm$^2$. During the run, the beam particle current was 128 nA and the tape transport speed was 7.2 m/hr. After the roll-to-roll irradiation, the 46 mm insert strip was roll slit to multiple 4 mm wide slits. The critical current measured, at 77K in self-field, on a section of the 80 meter long insert strip before the irradiation was about 375 A/cm-w. The 77K critical current, in self-field, was measured along the length of one of the 4 mm strips after irradiation using a TapeStar instrument as described in Example 4. FIG. 16 shows the critical current was about 250 A along the entire length of the 4 mm strip. The uniform decrease in the critical current at 77K, self-field shows that the irradiation dose and hence defect structure was consistent along the length of the 80 meter strip.

Example 7

Figure 17:
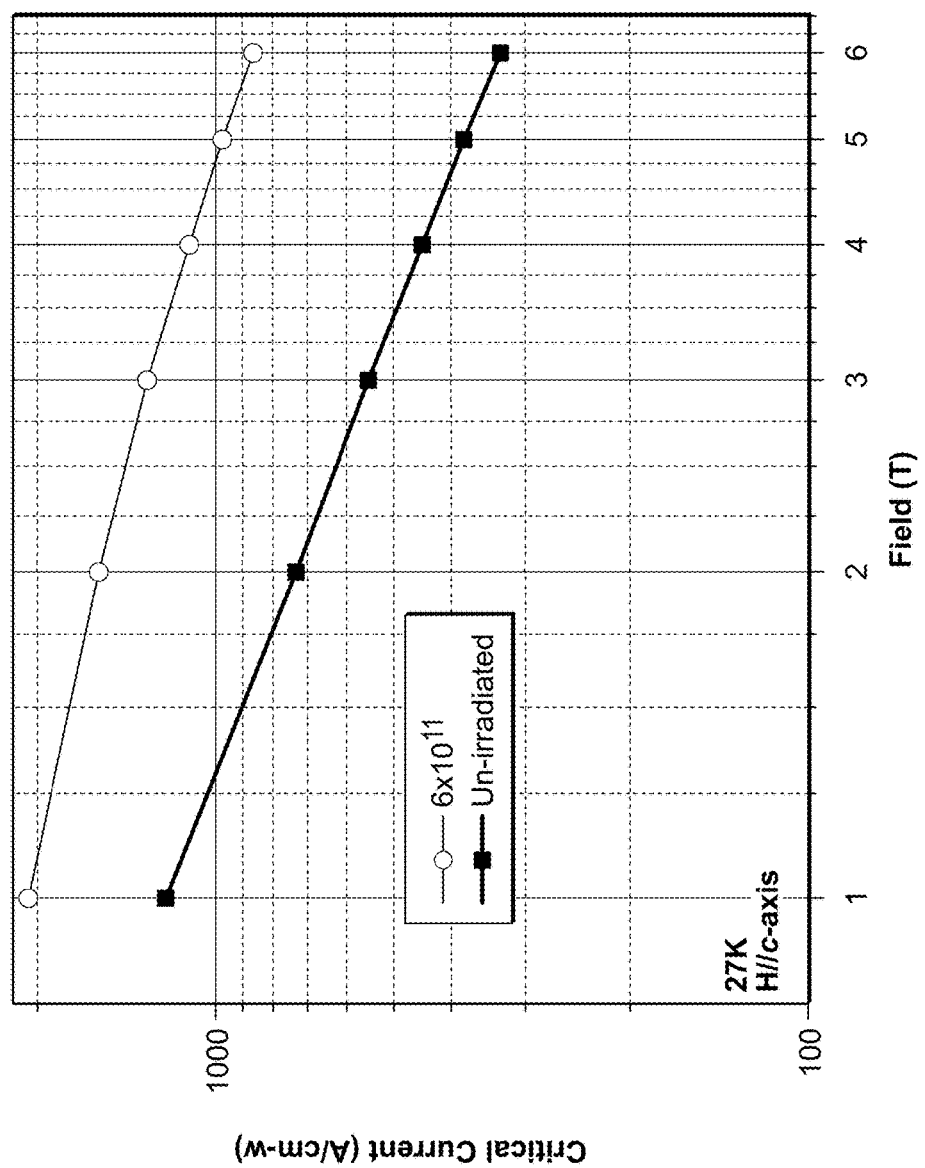
FIG. 17 shows the critical current of a wire as a function of temperature and applied magnetic field (perpendicular to the tape surface) made from a 46 mm wide insert strip irradiated with 18 MeV $Au^{5+}$ ions to a dose of $6 \times 10^{11}$ ions/cm$^2$ in a roll-to-roll process and the critical current of an un-irradiated wire.

The transport critical current of a wire, prepared with the optimum exposure of Au ions as described in Example 4, was measured as a function of the temperature, the strength of the magnetic field and the orientation of the magnetic field. FIG. 17 shows the critical current of the wire at 27K as a function of applied magnetic field for the field oriented perpendicular to the wire surface. It also shows the critical current of wire, measured under the same conditions, made as described in Example 1. It further shows that of the roll-to-roll irradiation of the wire produces an enhancement of greater than a factor of two at applied magnetic fields of greater than approximately 1.5 T compared to an un-irradiated wire.

Figure 18B:
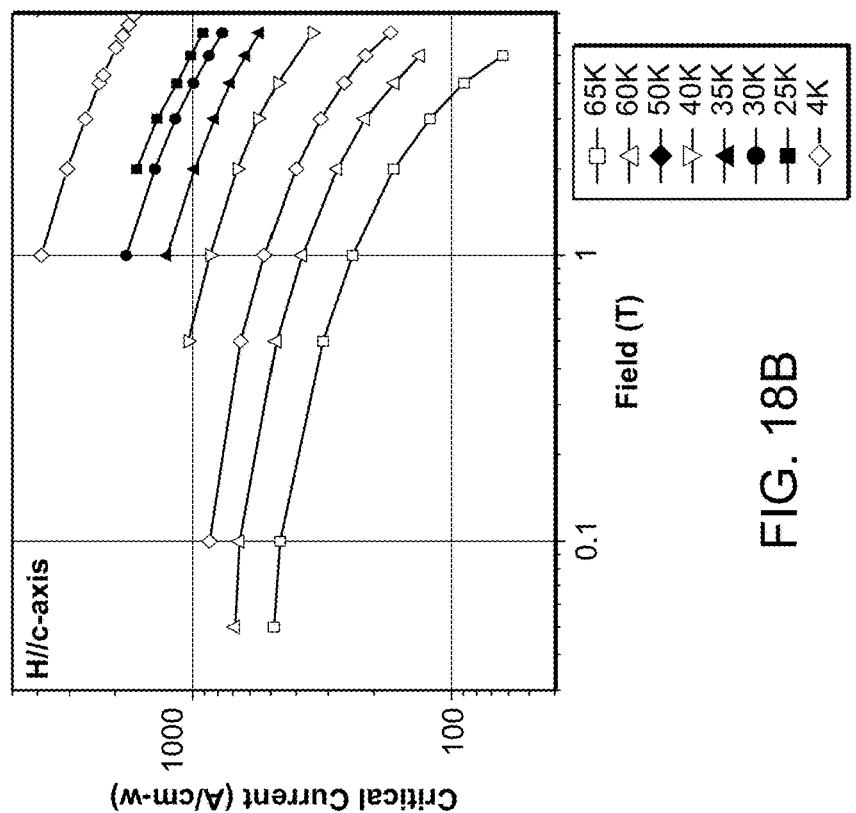
FIGS. 18A and 18B show the transport current of the wire made as described in Example 6 as a function of the orientation of the applied magnetic field at multiple temperatures.
Figure 18A:
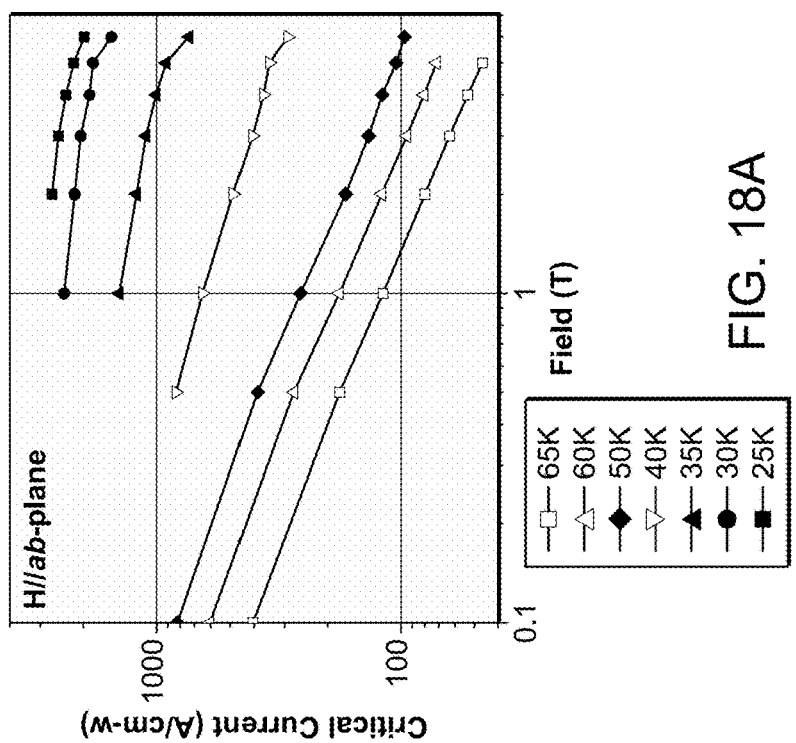

FIG. 18A and FIG. 18B show the transport current of the wire made as described in Example 6 as a function of the orientation of the applied magnetic field at multiple temperatures. The YBCO film included rare-earth oxide precipitates having the general formula $RE_2O_3$ where RE is a mixture of Y and Dy and diameters of several tens of nanometers.

While preferred embodiments of the present invention have been shown and described herein, various modifications may be made thereto without departing from the inventive idea of the present invention. Accordingly, it is to be understood the present invention has been described by way of illustration and not limitation. Other embodiments are within the scope of the following claims.

What is claimed is:

1. A method for producing a long length high temperature superconductor wire, comprising:
providing a substrate, having a surface with a length of at least 50 meters and a width, the surface supporting a biaxially textured high temperature superconducting layer, the biaxially textured high temperature superconducting layer having a length and a width corresponding to the length and width of the surface of the substrate;
irradiating the biaxially textured high temperature superconductor layer with an ion beam impinging uniformly along the length and across the width of the biaxially textured high temperature superconductor layer to produce a uniform distribution of pinning microstructures in the biaxially textured high temperature superconductor layer; and
wherein the step of irradiating includes moving the biaxially textured high temperature superconductor layer in a continuous manner under the ion beam and wherein the ion beam is shaped in a rectangular pattern.

2. The method of claim 1 wherein the step of providing comprises:
disposing at least one buffer layer on the substrate;
forming the biaxially textured high temperature superconductor layer on the at least one buffer layer;
depositing a metallic protective coating on the biaxially textured high temperature superconductor layer;
performing an oxygenation heat treatment to anneal the metallic protective coating and oxygenate the biaxially textured high temperature superconductor layer; and
wherein the step of irradiating includes impinging the ion beam uniformly on the surface of the metallic protective coating.

3. The method of claim 2 wherein the metallic protective layer comprises Ag with a thickness of between 0.25 to 1.5 μm.

4. The method of claim 2 wherein the irradiating step includes impinging on the metallic protective coating the ion beam with an ion energy of 1 to 25 MeV.

5. The method of claim 4 wherein the ion beam energy is selected to achieve substantially full penetration of the impinging ions in the metallic protective coating and the biaxially textured high temperature superconductor superconductor layer.

6. The method of claim 1 wherein a long edge of the rectangular pattern of the ion beam is oriented parallel to the length of the biaxially textured high temperature superconductor layer.

7. The method of claim 6 wherein the ion beam is rastered at a rate of 0-100 kHz and traverses a distance 1.0-10 cm greater than the width of the moving biaxially textured high temperature superconductor layer.

8. The method of claim 1 wherein the ion beam comprises a positively charged ion with energy in the range of 1-25 MeV.

9. The method of claim 8 wherein the ion beam comprises one of Au, Ar, Xe ions with a charge of from 1+ to 10+.

10. The method of claim 1 wherein the moving step includes moving the biaxially textured high temperature superconductor wire in a continuous manner under the ion beam, at a rate of between 6 m/hr and 1000 m/hr.

11. The method of claim 10 wherein the moving biaxially textured high temperature superconductor layer can be actively cooled to maintain the temperature below 300° C.

12. The method of claim 1 wherein the step of moving the biaxially textured high temperature superconductor layer in a continuous manner under the ion beam includes moving the biaxially textured high temperature superconductor layer under the ion beam a plurality of times.

13. The method of claim 12 wherein moving the biaxially textured high temperature superconductor layer high temperature superconductor layer under the ion beam a plurality of times includes using a reel to reel process with the high temperature superconductor wire being wound helically around the reels.

14. The method of claim 12 wherein when the biaxially textured high temperature superconductor layer is moved under the ion beam a plurality of times, each time the ion beam utilizes different ion particles and/or different energies.

15. The method of claim 1 wherein the pinning microstructures have a substantially uniform size.

16. The method of claim 15 wherein the substantially uniform size of the pinning microstructures is defined as at least 90% of the pinning microstructures in a volume of the biaxially textured superconductor layer having a size of <20 nm.

17. The method of claim 1, wherein the biaxially textured high temperature superconducting layer comprises a rare earth metal-alkaline earth metal-transition metal-oxide superconductor layer having a material with the general formula: $(RE)Ba_2Cu_3O_7$ where RE is at least one rare earth metal.

18. The high temperature superconductor wire of claim 17, wherein RE comprises yttrium.

19. The method of claim 1 wherein the rectangular pattern of the ion beam has an aspect ratio of between 1.1:1 to 20:1.

20. The method of claim 1 wherein the rectangular pattern of the ion beam has an aspect ratio of between 2:1 to 10:1.

21. The method of claim 1 wherein the ion beam is shaped in a rectangular pattern and a long edge of the rectangular pattern is oriented perpendicular to the length of the biaxially textured high temperature superconductor layer, and wherein the beam is wider than the moving tape by a factor of at least two.

22. The method of claim 1 wherein the beam has an ion bean current selected to prevent heating of the biaxially textured high temperature superconductor layer to temperatures above about 300° C. during the irradiation step.

23. The method of claim 1 wherein the area of the biaxially textured high temperature superconductor layer irradiated per minute is greater than 0.25 $m^2$/hr.

24. The method of claim 1 wherein the ion beam has an ion particle current of >0.5 µA.

25. The method of claim 1 wherein the width of the biaxially textured high temperature superconductor layer is between 4 mm to 200 mm.

26. The method of claim 1 wherein the superconductor wire is configured as a single strip or as multiple strips along the length.

27. The method of claim 1 wherein the ion beam impinges on the biaxially textured high temperature superconductor layer at an angle perpendicular to the surface of the biaxially textured high temperature superconductor layer.

28. The method of claim 1 wherein the ion beam impinges on the biaxially textured high temperature superconductor layer at an angle of between 0 and 75° from an axis perpendicular to the surface of the biaxially textured high temperature superconductor layer.

29. The method of claim 1 wherein the ion beam impinges on the biaxially textured high temperature superconductor layer simultaneously at a continuous range of angles from 0 to ±45° from an axis perpendicular to the surface of the biaxially textured high temperature superconductor layer.

30. The method of claim 1, wherein the biaxially textured high temperature superconducting layer has a thickness of greater than 1 µm.

31. A method for producing a long length high temperature superconductor wire, comprising:
providing a substrate, having a surface with a length of at least 50 meters and a width, the surface supporting a biaxially textured high temperature superconducting layer, the biaxially textured high temperature superconducting layer having a length and a width corresponding to the length and width of the surface of the substrate;
irradiating the biaxially textured high temperature superconductor layer with an ion beam impinging along at least a portion of the length and across at least a portion of the width of the biaxially textured high temperature superconductor layer, wherein the step of irradiating includes rastering the ion beam across the width of the moving biaxially textured high temperature superconductor layer to produce a uniform distribution of pinning microstructures in the biaxially textured high temperature superconductor layer; and
moving the biaxially textured high temperature superconductor layer in a continuous, longitudinal manner under the ion beam.

32. The method of claim 31 wherein the ion beam is rastered at a rate of 0-100 kHz and traverses a distance 1.0-10 cm greater than the width of the moving biaxially textured high temperature superconductor layer.

* * * * *